(12) United States Patent
Yoshida et al.

(10) Patent No.: US 9,594,930 B2
(45) Date of Patent: Mar. 14, 2017

(54) EXTENDED ANALOG COMPUTER APPARATUS

(71) Applicant: Indiana University Research and Technology Corp., Indianapolis, IN (US)

(72) Inventors: Ken Yoshida, Carmel, IN (US); Bryce Himebaugh, Bloomington, IN (US); Shaoyu Qiao, Indianapolis, IN (US); Muller Soliman, Carmel, IN (US)

(73) Assignee: Indiana University Research and Technology Corporation, Indianapolis, IN (US)

( * ) Notice: Subject to any disclaimer, the term of this patent is extended or adjusted under 35 U.S.C. 154(b) by 224 days.

(21) Appl. No.: 14/383,084

(22) PCT Filed: Mar. 5, 2013

(86) PCT No.: PCT/US2013/029133
§ 371 (c)(1),
(2) Date: Sep. 4, 2014

(87) PCT Pub. No.: WO2013/134270
PCT Pub. Date: Sep. 12, 2013

(65) Prior Publication Data
US 2016/0026210 A1    Jan. 28, 2016

Related U.S. Application Data

(60) Provisional application No. 61/606,741, filed on Mar. 5, 2012, provisional application No. 61/680,077, filed on Aug. 6, 2012.

(51) Int. Cl.
*G06G 7/00* (2006.01)
*G06F 1/16* (2006.01)
*G01R 19/00* (2006.01)

(52) U.S. Cl.
CPC ............ *G06G 7/00* (2013.01); *G06F 1/16* (2013.01); *G01R 19/0084* (2013.01)

(58) Field of Classification Search
CPC ... G06F 1/16; G06G 7/00; G06G 7/06; G06G 7/12; G06G 7/48
(Continued)

(56) References Cited

U.S. PATENT DOCUMENTS 3,924,109 A    12/1975  Jhu et al.
5,770,966 A     6/1998  Mills
(Continued)

OTHER PUBLICATIONS

International Search Report and Written Opinion mailed Jun. 26, 2013 from the International Searching Authority in priority application No. PCT/US2013/029133, 8 pgs.
(Continued)

*Primary Examiner* — William Hernandez
(74) *Attorney, Agent, or Firm* — Faegre Baker Daniels LLP

(57) ABSTRACT

An extended analog computer includes an electrically conductive material with a plurality of sides. At least one of the sides is isolated from an electrical ground and at least one other side is electrically grounded. A plurality of electrically conductive pins is arranged in the electrical conductor. At least one voltage sensor is arranged in the electrical conductor proximate to the at least one side that is isolated from the electrical ground.

23 Claims, 21 Drawing Sheets

(58) Field of Classification Search
USPC .................. 327/50, 91, 94, 99, 334, 551
See application file for complete search history.

(56) References Cited

U.S. PATENT DOCUMENTS

| | | | |
|---|---|---|---|
| 5,796,919 | A | 8/1998 | Kubica et al. |
| 5,917,338 | A | 6/1999 | Mills |
| 6,229,376 | B1 * | 5/2001 | Geysen .................. G05F 3/265 327/355 |
| 7,825,688 | B1 | 11/2010 | Snyder et al. |
| 8,219,506 | B2 * | 7/2012 | Eberhart .................. G06G 7/06 706/3 |
| 2004/0065741 | A1 | 4/2004 | Reddersen et al. |
| 2005/0172044 | A1 | 8/2005 | Chien et al. |
| 2006/0139200 | A1 | 6/2006 | Jensen |
| 2006/0212209 | A1 | 9/2006 | Cesario et al. |
| 2007/0294326 | A1 | 12/2007 | Saryal |
| 2010/0030711 | A1 | 2/2010 | Eberhart et al. |
| 2011/0131440 | A1 | 6/2011 | Noda |

OTHER PUBLICATIONS

Mills et al., ""Empty Space" Computes: The Evolution of an Unconventional Supercomputer" In: ACM Computing Frontiers Conference, pp. 115-126, 2006.

Greer, Douglas S., "A Unified System of Computational Manifolds, Technical Report TR-CIS-0602-03," (2003), downloaded from http://www.gmanif.com/pubs.html, 29 pgs.

Mills, Jonathan, "The New Computer Science and Its Unifying Principle," (2005), downloaded from http://www.cs.york.ac.uk/nature/workshop/papers/Mills.pdf, 5 pgs.

Mills, Jonathan, "Kirchloff-Lukasiewics Machines," downloaded from http://www.cs.indiana.edu/~jwmills/ANALOG.NOTEBOOK/klm/klm.html, downloaded Mar. 1, 2012, 9 pgs.

* cited by examiner

EXTENDED ANALOG COMPUTER APPARATUS

CLAIM OF PRIORITY

This application is a National Phase entry of International Patent Application No. PCT/US2013/029133, filed Mar. 5, 2013, entitled "EXTENDED ANALOG COMPUTER APPARATUS," which claims the benefit under 35 U.S.C. §119(e) of U.S. Provisional Patent Application No. 61/606,741 filed Mar. 5, 2012 and U.S. Provisional Patent Application No. 61/680,077 filed Aug. 6, 2012. The entire disclosures of said patent applications are incorporated by reference herein.

TECHNICAL FIELD

The present disclosure relates generally to computing devices, and, more specifically, to extended analog computing devices.

BACKGROUND

Computers are used in a wide variety of applications in modern society. In the vernacular, the term "computer" has become synonymous with digital computers. A digital computer performs mathematical operations on discrete data, typically binary data, and generates a discrete output. The binary data are formed from a plurality of "bits" that can take one of two values, often represented as on/off or "1" and "0" values. Digital computers process the binary data algorithmically using software to enable a single digital computing device to perform a wide range of computations based on different algorithms. Digital computers can be used to generate analog outputs, such as visual graphics, sound, and other electromagnetic signals, using various forms of digital to analog converters.

While digital computers are well-known, a computer does not have to be a digital computer. In a broader definition, the term "computer" refers to any physical object that can be reconfigured to solve multiple problems. That is to say, a computer can generate an "answer" to many different "questions". Digital computers generate answers to questions using one or more algorithms, which are a series of individual computations that eventually generate an answer to a question. Analog computers are another type of computer that are physically configured to generate an "answer" based on a particular input without using the step-by-step algorithms of a digital computer. In one known example of an analog computer, an operational amplifier (OpAmp) is configured in an electrical circuit to generate an output voltage using two input voltages. The output voltage represents the "answer" to a simple computation such as adding, subtracting, or multiplying the two input voltages. While a digital computer operates on discrete values of data, the analog OpAmp can theoretically accept an infinite number of different voltage levels that are within a practical operating range of the OpAmp circuit. In the example analog computer, the configuration of components and the laws of physics, in this case the laws governing how electrical currents flow through a physical OpAmp device, determine the answer to the question. Reconfiguration of the analog computer can generate answers to different questions.

Both digital and analog computers have advantages and disadvantages. A classical digital computer reconfigures itself quickly to answer new questions by loading software and performing the algorithms in the software. Certain types of questions, however, are difficult for digital computers to solve in reasonable amounts of time. For example, physical simulations that are modeled with complex mathematical equations including partial differential equations and ordinary differential equations. Complex simulations can often include random elements, modeled as stochastic processes, based on randomness observed in nature. While digital computers can perform simulations algorithmically, the performance of digital computers, even supercomputers that include large numbers of individual digital computers working together, is often ineffective at simulating certain phenomena. In some cases, an analog computer can perform the equivalent computations of a complex physical simulation much more efficiently than a digital computer. The analog computer can include inherently random elements that model stochastic processes more easily that with pseudo-random algorithms commonly employed in digital computers. The analog computer, however, may have to be unreasonably complex to perform a complex simulation. Additionally, a traditional analog computer cannot be reconfigured easily to answer multiple types of question or variations in the question. For example, configuring a traditional analog computer to perform a simulation can include wiring a large number of electrical components together into a predetermined configuration to solve a particular problem.

An extended analog computer (EAC) combines the advantages of both analog and digital computers. Existing EACs include an electrically conductive material, such as gelatin or anti-static conductive foam commonly used to pack electronic equipment, and two or more electrically conductors or "pins" engaged to the electrically conductive material. Each pin can act as either an input (source) or an output (sink) for an electrical current. The electrical current flows from an input pin to an output pin through the electrically conductive material. In a typical embodiment, numerous pins are placed in the electrical conductor and an outside controller, which can be a digital computer, selectively applies electrical signals to some of the pins as sources and then monitors the corresponding electrical current that flows to one or more sink pins. The spatial orientation of the pins and selected electrical signals applied to the source pins generates a stationary current density manifold through the electrically conductive material. The selective activation of source pins and monitoring of sink pins enables a modeling of wide range of mathematical relationships, including differential equations and piece-wise linear functions. Unlike traditional analog computers, the EAC reconfigures rapidly by selection of different arrangements of source and sink pins using electromechanical or solid-state switches.

While EACs can perform various tasks quickly, existing EAC designs have limitations in the realm of signal processing, and more generally in the realm of processing time varying input signals. For example, adaptive signal filtering is a common task in signal processing where a filter changes dynamically to remove noise from an electromagnetic signal. Typically, the electromagnetic signal and the noise are time varying, which is to say that the values of the input signals change over time. In a traditional EAC, the time-varying input signals generate fluctuations in the electrical current flowing between sources and drains within the conductive material of the EAC. Consequently, the current density manifold within the EAC changes while the EAC is generating the solution, resulting in an unstable output. Thus, traditional EACs are often ineffective in processing time varying input signals, including adaptive filtering applications. Consequently, improvements to EACs that enable processing of time varying inputs would be beneficial.

SUMMARY

This document describes a potential mode EAC, which operates in a different mode than existing EACs. The difference with the potential mode EAC is that current sources and sinks are inputs, and potential measurements at multiple locations within the space are the output. Since the current source has an effectively infinite output impedance, and potential measurements imply measurement points with effectively infinite input impedances, the potential distribution created by each input current source is independent of each other. The relationship between each source/sink and voltage monitoring point, i.e. the coupling weight between one or more inputs and each output point is independent of each other. Thus, additional inputs only add complexity to the mathematical expression being solved, without influencing the other inputs.

In one embodiment, an extended analog computer that processes time varying input signals has been developed. The extended analog computer includes an electrically conductive material formed with a plurality of sides, at least one of the plurality of sides being isolated from an electrical ground, a ground conductor electrically connected to another one of the plurality of sides of the electrically conductive material, a plurality of electrically conductive pins arranged in the electrically conductive material, each of the plurality of electrically conductive pins being configured to input an electric current into the electrically conductive material, and at least one voltage sensor positioned in the electrically conductive material.

DETAILED DESCRIPTION

Figure 1:
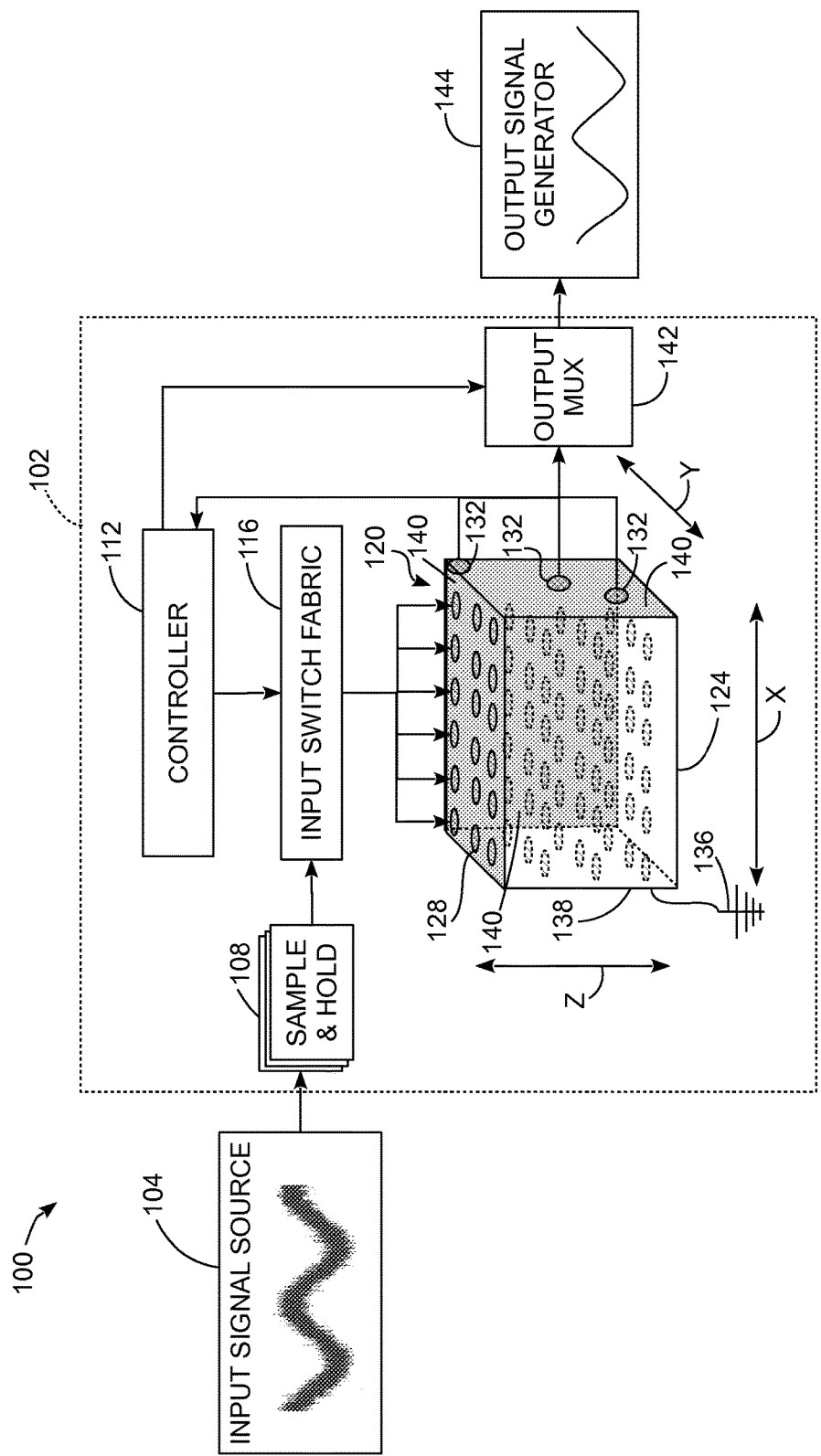
FIG. 1 is a schematic diagram of an extended analog computer (EAC) that is configured to filter an electrical signal.

The description below and the accompanying figures provide a general understanding of the environment for the system and method disclosed herein as well as the details for the system and method. In the drawings, like reference numerals are used throughout to designate like elements.

FIG. 1 depicts a signal processing system 100 that includes an extended analog computer (EAC) 102. The system 100 includes an input signal source 104, the EAC 102, which is configured to perform an adaptive filtering operation in the system 100, and an output signal generator 144. The input signal source 104 receives a time varying electrical signal. In one example, the input signal source 104 is an electrical signal corresponding to neural impulses in the human nervous system. The input signal can, however, be any time varying electromagnetic signal. In some embodiments, the input signal source 104 generates an amplified output of the original input signal. In one embodiment, the output signal generator 144 is a voltage controller current source (VCCS). The output signal generator generates an output electrical current under control of an output voltage signal generated by the EAC 102. As described below, in one configuration the EAC generates a filtered voltage signal corresponding to a noisy input signal from the input signal source 104, and the output signal generator generates a corresponding filtered output current signal.

The EAC 102 includes a plurality of analog sample & hold buffers 108, a controller 112, an input switch fabric 116, an analog processor 120, and an output multiplexer 142. The sample & hold buffers generate a series of time-delayed versions of the input signal from the input source 104. In a serial configuration, the sample & hold buffers 108 generate a plurality of incrementally time delayed versions of the input signal. The number of sample & hold buffers incorporated into the EAC is related to the number of taps for a filter implemented by the EAC 102. For example, when the EAC 102 is configured as a filter with N taps, the EAC uses a total of N−1 sample & hold buffers, one for each of N−1 delayed signals, and the remaining signal buffer is a non-delayed input to the filter.

The analog processor 120 includes an electrically conductive material 124, input pins 128, voltage sensors 132, electrically grounded sides 138, and electrically isolated sides 140. An electrically conductive polymer foam 124 forms the electrically conductive material in FIG. 1, although numerous other electrically conductive materials including gelatin or a conductive fluid can be used as well. In one embodiment, the electrically conductive material 124 has an electrical conductivity a of approximately 1 Siemen per meter (S/m). In a cubic configuration, the electrically conductive material 124 is an isotropic conductor. That is to say, the electrical conductivity of the conductive material 124 is substantially the same regardless of the flow direction of an electric current in the conductive material 124. The polymer foam 124 is formed with a generally cubic shape having six sides and a predetermined width (X), length (Y), and height (Z). In one embodiment, the polymer foam 124 is formed in a cubic block with each of the width, length, and height being approximately one meter.

Figure 2:
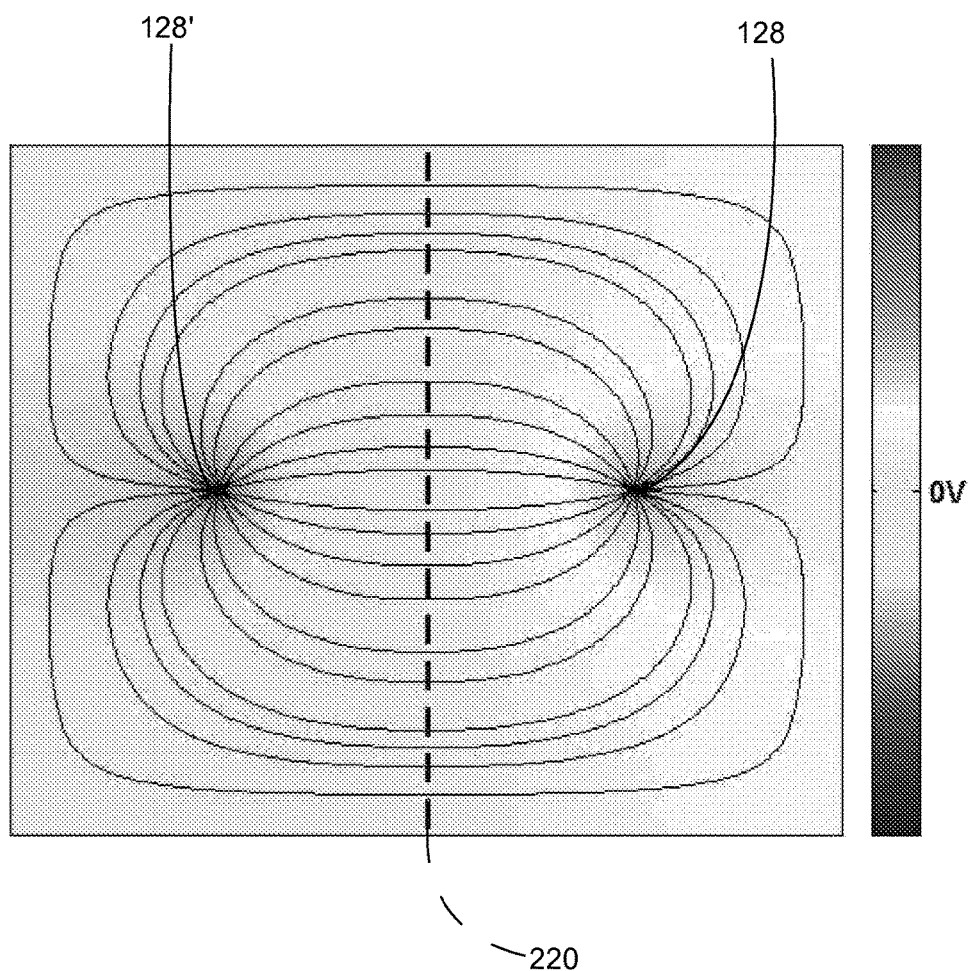
FIG. 2 is a diagram of charge potentials between a current source and a current sink in an electrically conductive material.

The electrically grounded sides 138 of the electrically conductive material 124 can be connected to conductive foil, plates, or other conductors that provide a uniform path for electricity to flow to ground 136 through the electrically conductive material 124. The electrically grounded sides 138 form a boundary for the electrical current, which is modeled mathematically as a Neumann boundary condition. As depicted in FIG. 2, the charge potentials for an electrical current propagating from a current source 128 to a sink 128' are substantially symmetrical on either side of the boundary 220. In prior art analog processors, a second pin 128' acts as the sink for the electrical current. Because the EAC 102 does not measure current flux, the entire line 220 represents a ground plane, and the electrical current flows to the ground with the right-hand side of the charge potentials depicted in FIG. 2 remaining substantially unchanged. The EAC 102 measures the charge potentials around one or more of the input pins 128.

Figure 3:
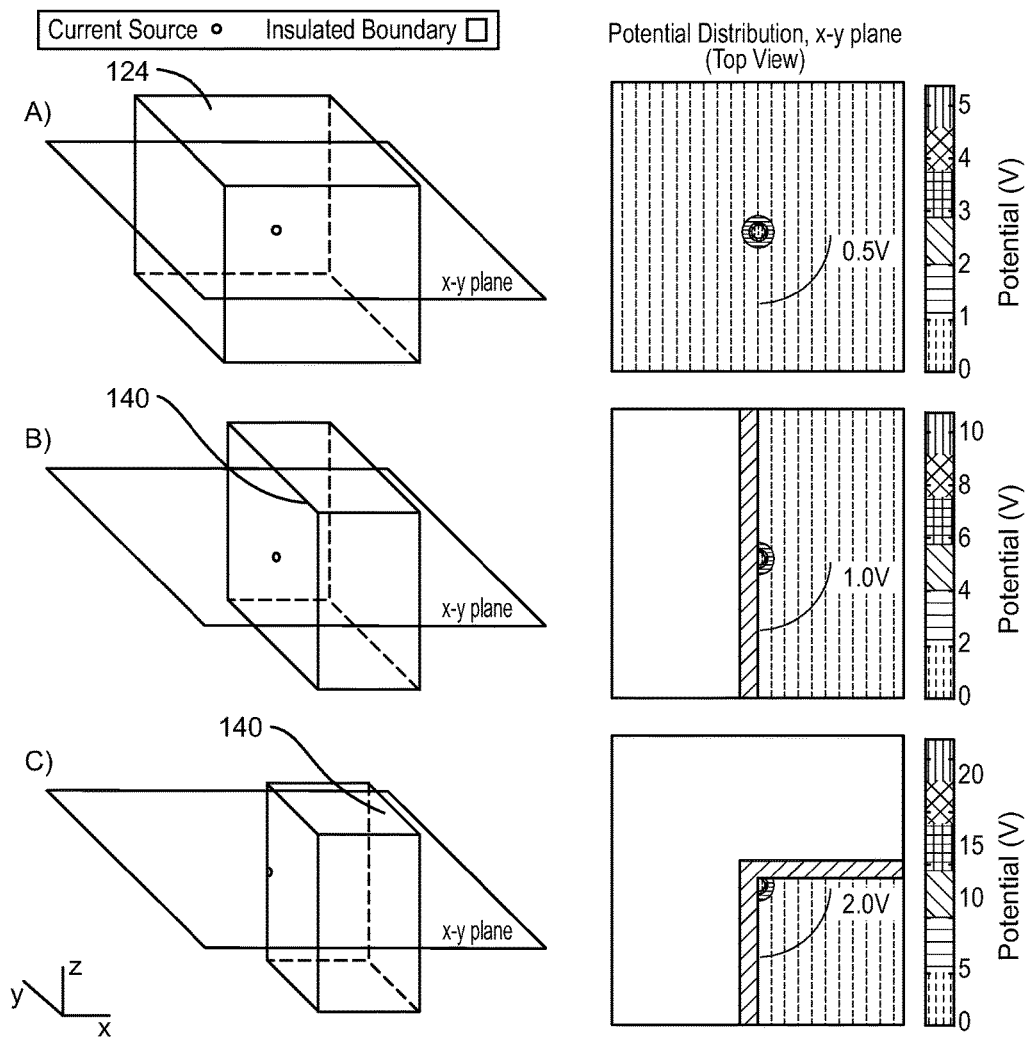
FIG. 3 is a diagram depicting reflections of an electrical signal from electrically isolated sides of an electrically conductive material.

In a simple embodiment, the analog processor 120 is implemented as a set of current source points and potential detection points on the surface or within the volume of the electrically conductive material 124 that is grounded on all sides. In the example of FIG. 1, however, at least one side 140 of the electrically conductive material 124 is isolated from electrical ground. The electrically isolated, or insulated, sides 140 can be exposed to air or be covered with an electrical insulator. As depicted in FIG. 3, the electrically isolated sides 140 reflect electrical current back into the electrically conductive material 124. When an input pin 128 is positioned proximate to the side 140, the reflected input signals increases the charge potential around the input pin at a predetermined distance from the input pin. When two or more electrically isolated sides join at a corner, multiple reflections of the electrical signal generate a greater increase in the charge potential. In some configurations, the positioning of input pins 128 or voltage sensors 132 near at least one electrically isolated side 140 increases the efficiency of the analog processor 120 due to the reflection of the input signals.

In the analog processor 120, the voltage sensors 132 are located proximate to an insulated side 140 of the electrically conductive material 124. The insulated side 140 effectively acts as an insulating plane that bisects an "imaginary" cubic volume midway along the X axis. The current density from any source that is injected normal to the surface of the injection point flows radially flows to the boundary. Cutting the space in half with an insulator bisecting the space on the plane where all the input/output points are located, bisects the current distribution into two spaces. Each of the two spaces has half the total current, but the distribution of potential and current density in each of the two spaces does not change. This is because, none of the current density crosses the volume at the bisecting plane. This means that the same potential distribution in each half space is maintained with half the current, and the "imaginary" second half of the electrically conductive material 124 is not required in the analog processor 120. For a rectilinear or cubic volume conductor, orthogonal planes on the X, Y, and Z axes bisect the space symmetrically. If each of these planes are defined as insulators, then the required volume of electrically conductive material 124 is reduced without changing the current density distribution or potential distribution in the space.

Due to the symmetry of the bisected volume, the current flux at a corner of the electrically conductive material cube 124 is effectively unchanged from a current flux located at the center of a cubic volume that is eight times larger than the electrically conductive cube 124. Three electrically isolated sides 140 joined at a corner effectively increase the sensitivity of a voltage sensor 132 positioned at the corner of by a factor of eight. The effective sensitivities of voltage sensors 132 that are positioned along an edge of the cube 124 between two of the electrically isolated sides 140 and voltage sensors that are positioned proximate to one electrically isolated side 140 are increased by factors of four and two, respectively. Thus, the need to amplify the input signals is reduced, the electrically conductive material 124 can occupy a smaller volume, and the EAC 102 consumes less electrical energy during operation.

The input pins 128 are arranged in the electrically conductive foam 134 in a three-dimensional grid pattern. In FIG. 1, the input pins 128 are spaced apart equidistant from each other similarly to vertices in a series of stacked cubes. In alternative embodiments, the input pins 128 are arranged differently and are not necessarily spaced apart equally. For example, the pins are arranged in a plurality of radial lines extending outward from the voltage sensors 132. The input pins 128 are arranged in a denser configuration near the voltage sensors 132, and are spaced at increasingly greater intervals as the distance from the voltage sensors increases. In an alternative embodiment, the electrically conductive material 124 is formed from a sheet of conductive material, and the input pins 128 and voltage sensors 132 are arranged in a two-dimensional configuration on the sheet instead of the three-dimensional configuration of FIG. 1.

Figure 4A:
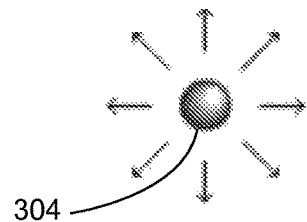
FIG. 4A is a view of a spherical input pin.
Figure 4B:
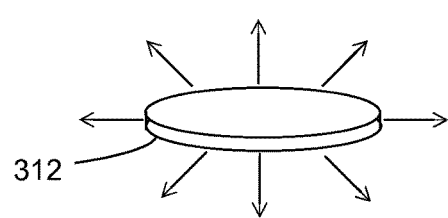
FIG. 4B is a view of a disc-shaped input pin.
Figure 4C:
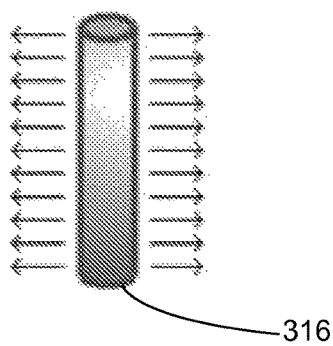
FIG. 4C is a side view and top view of a cylindrical input pin.
Figure 4C:
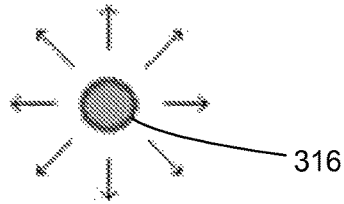

Each of the input pins 128 is formed from an electrical conductor, typically a metal, with an insulated electrical lead that is electrically connected to the input switch fabric 116. The size and shape of each input pin affects the manner in which an electrical current radiates from the input pin 128 through the electrically conductive material 124. In FIG. 4A, a spherical conductor 304 radiates electrical current equally in all directions. The spherical conductor 304 operates in a similar manner to an infinitely small point-source emitter. In FIG. 4B, a disc-shaped pin 312 emits the electrical current equally in all directions in a two-dimensional plane. The analog processor 120 uses disc-shaped input pins 128. In FIG. 4C, an input pin 316 has a cylindrical shape. The cylindrical input pin 316 emits the electrical current perpendicular to the longitudinal axis of the cylinder. In some three-dimensional analog processors, a cylindrical input pin extends along substantially all of the length, width, or height of the electrically conductive material in the analog processor.

During operation of the system 100, the controller 112 in the EAC 102 selectively applies input signals from the sample & hold buffers 108 to the input pins 128. In the embodiment of FIG. 1, the controller 112 is a digital computer that includes one or more digital microcontrollers, central processing units, field programmable gate arrays (FPGAs), application specific integrated circuits (ASICs), and the like. The controller 112 routes the input signals to selected input pins 128 with an input switch fabric 116. The input switch fabric 116 is an electromechanical or solid-state switching device that electrically connects the output of each sample & hold buffer 108 to one of the input pins 128. In some embodiments, the input switch fabric 116 can electrically connect a single input signal to a plurality of the input pins 128 concurrently. The controller 112 also selects the output of one of the voltage sensors 132 to output to the signal generator 144 with the output multiplexer 142. The controller 112 also monitors the outputs of at least one of the voltage sensors 132, which can be used for feedback to change the selected input pins 128 with the input switch fabric 116.

The analog processor 120 differs from analog processors that are used in existing EACs. First, the pins 128 only act as inputs for the input signal, instead of being configured as either inputs or outputs. The pins 128 that are not selected to act as an input for the signal are configured with a high-impedance, and the voltage sensors 132 also present high impedance to electrical signals. Substantially all of the electrical signal in the electrically conductive material 124 exits through the electrical ground 136 instead of through a sink pin. Another difference in the processor 120 is that at least one side of the electrically conductive material 124 is isolated from the ground 136. For example, in the processor 120, side 140 is not connected to the electrical ground 136. The electrically isolated sides tend to reflect a portion of the input signal as the input signal propagates through the electrically conductive material. Another difference is that the voltage sensors 132 measure outputs of the analog processor 120 with reference to a charge potential manifold that is generated in the electrically conductive material 124 instead of with reference to a current manifold corresponding to an electrical current that flows between a source pin and a sink pin.

Figure 5:
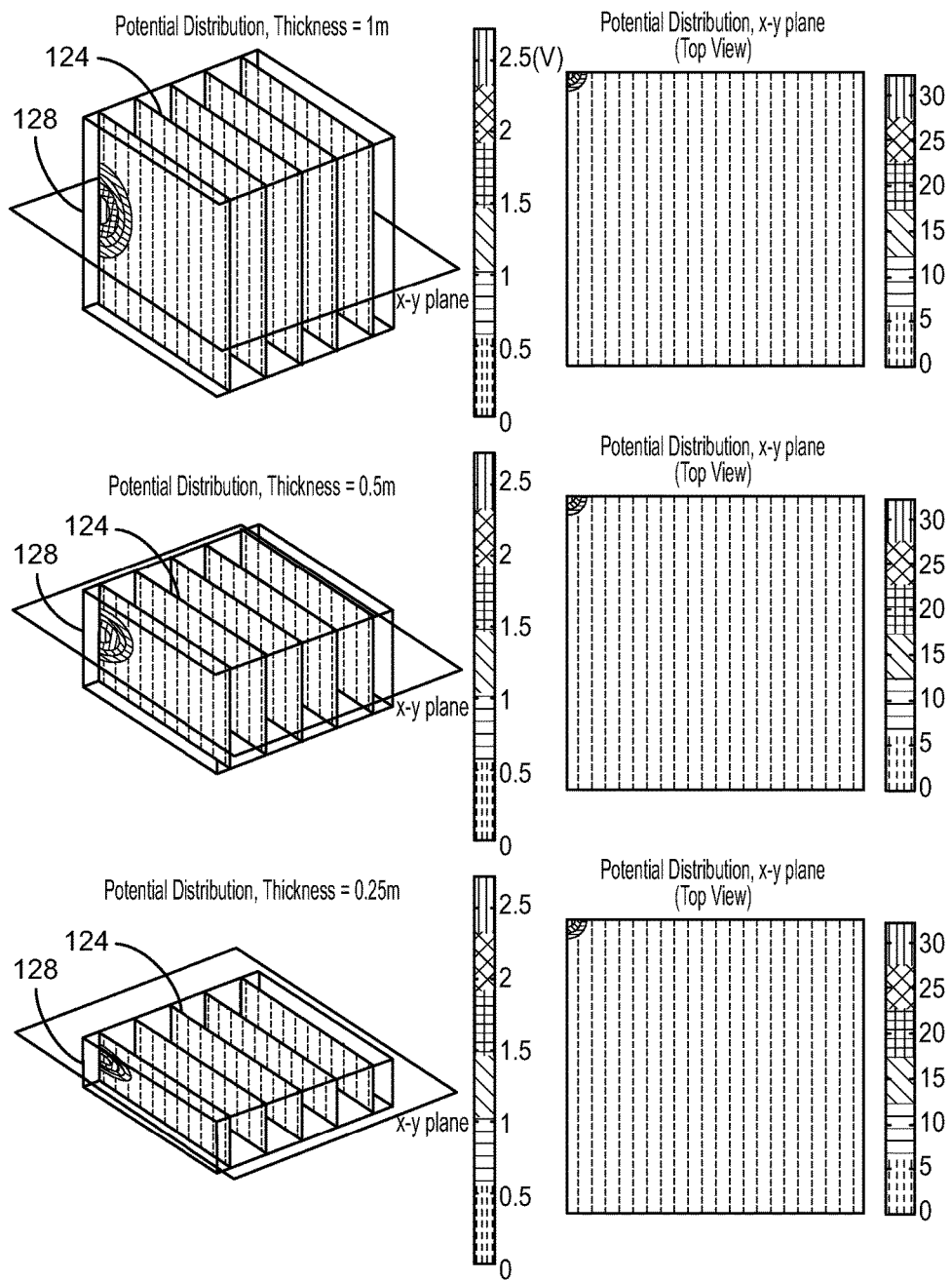
FIG. 5 is a schematic diagram of various dimensions and corresponding charge potential distributions of an electrically conductive material used in an analog processor.

In an alternative configuration, the electrically conductive material 124 is formed with non-uniform dimensions. For example, the height of the electrically conductive material 124 can be less than the length and the width of the electrically conductive material to reduce the physical dimensions of the EAC. FIG. 5 depicts changes in the charge potential around an exemplary input pin 128 as the height of the electrically conductive material 124 is reduced while the length and the width remain constant. The filter gain of FIG. 5 was found to be different as the thickness of the electrically isotropic conductive material changes. An anisotropic matrix formula compensates for the variations. The modified anisotropic media, described in the matrix listed below, compensates for the thickness effect on filter gain. This compensation enables design of a filter function using thinner sheets of the conductive material. When the dimensions of the electrically conductive material 124 are non-uniform, the electrically conductive material can be formed with anisotropic electrical conductivity instead of the isotropic conductivity for a cubic shape. For example, when the height (Z), or thickness, of the electrically conductive material is changed by a factor of t with reference to the width (X) and length (Y) of the material, then the electrically conductive material 124 has three conductivity values $\sigma_x$, $\sigma_y$, and $\sigma_z$ for each of the X, Y, and Z axes, respectively. The total conductivity is defined with the following equation:

$$\sigma = \begin{bmatrix} \sigma_x & 0 & 0 \\ 0 & \sigma_y & 0 \\ 0 & 0 & \sigma_z \end{bmatrix} = \begin{bmatrix} \frac{\sigma_x}{t} & 0 & 0 \\ 0 & \frac{\sigma_y}{t} & 0 \\ 0 & 0 & t\sigma_z \end{bmatrix}.$$

Figure 6:
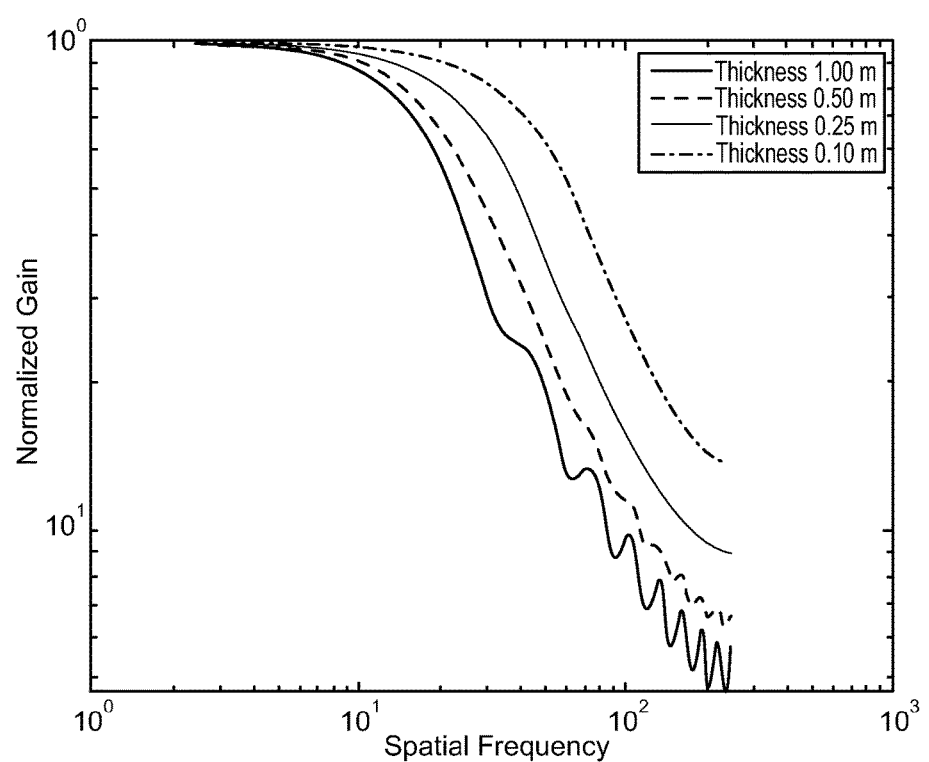
FIG. 6 is a frequency graph of normalized gain in different dimensions of isotropic electrically conductive material.

For example, if the thickness of the electrically conductive material is reduced by half (t=½) then the conductivity values $\sigma_x$, $\sigma_y$ for the width and height, respectively, should be double the conductivity value of $\sigma_z$ to maintain a charge distribution that is substantially equivalent to a cubic block. FIG. 6 depicts the gain factors for different thicknesses of the electrically conductive material 124 when the EAC 102 is configured as a filter for a time-varying input signal. The anisotropic matrix formula described above compensates for the variations in filter gain due to the different thicknesses depicted in FIG. 6, and enables the use of thinner conductive sheets with appropriate filter gain levels in an EAC.

While the EAC 102 includes a single three-dimensional analog processor 120, alternative EAC embodiments include multiple analog processors that are operatively connected to each other. For example, another EAC includes a series of two-dimensional analog processors formed from a sheet of electrically conductive material and input pins arranged in a two-dimensional array. At least one voltage sensor measures the charge potential, and the output of the voltage sensor is passed to a second voltage-controlled current source to generate an input current signal for another two-dimensional analog processor. A "stack" of multiple analog processors is configurable to perform more complex processing of time varying input signals.

Finite Impulse Response Filter

In the configuration of FIG. 1, the EAC 102 is configured to filter the signal from the input signal source 104. In one configuration, the EAC 102 acts as a finite impulse response (FIR) filter, including a predetermined number of taps and a resolution for each tap. Mathematically, the EAC 102 can be configured as an arbitrary discrete-time FIR filter with the general equation: $y[n] = \sum_{i=0}^{N} b_i x[n-i]$, where $y[n]$ is the filtered output signal at time n, $b_i$ are a set of N weight factors for an order N filter, and $x[n-i]$ represents the input signal $x[n]$ at the present time and for each of 1 . . . N discrete time increments in the past. As described in more detail below, the physical and electrical properties of the EAC 102 enable the EAC to generate multiple versions of the output signal y[n] with different weight values $b_i$ and other signal characteristics in parallel.

The spatial configuration of the input pins 128 around a given output pin 132 affects the operation of the FIR filter. The distance between the input pins 128 for each of the N taps, however, does not affect the operation of the filter. The function for the filter can be represented in a time-space relationship based upon the reciprocity theorem with the following equation:

$$V(j\omega) = \left(\frac{1}{f_s}\right)W\left(\frac{j\omega}{f_s}\right)I(j\omega)$$

where $V(j\omega)$ is a frequency-domain representation of the output signal, $f_s$ is the sampling frequency of the input signal, $W(j\omega)$ is the frequency-domain representation of the weighting function that is inversely linearly scaled by the inverse of the sampling rate. W is influenced by both the sampling rate and the locations of the inputs relative to the voltage sensor, which characterize the electrical coupling between the input current and the output voltage. $I(j\omega)$ is the frequency-domain representation of the input current for each tap in the filter. As seen above, at a given location of the input relative to the voltage sensor, the sampling frequency $f_s$ influences the operation of the filter in addition to the physical configuration of the analog processor 120.

Figure 7:
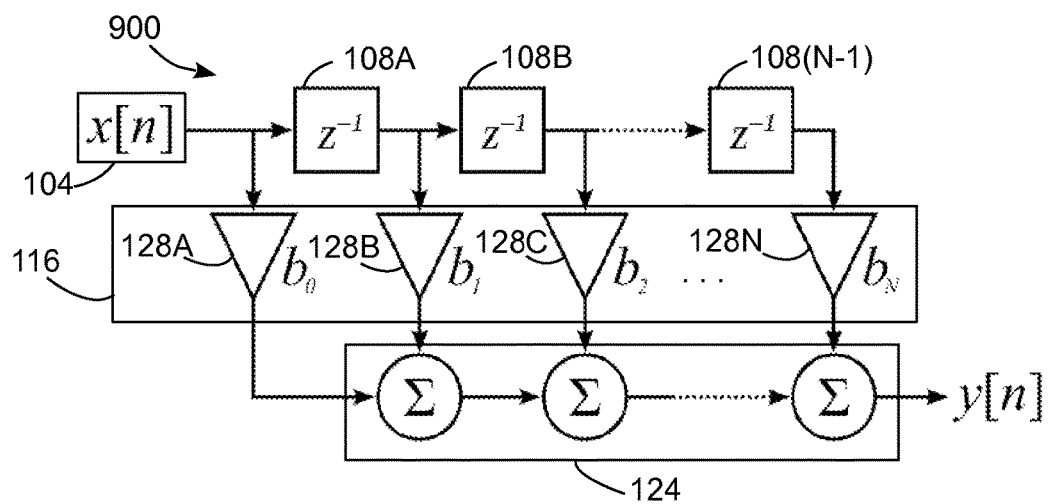
FIG. 7 is a schematic view of a finite input response (FIR) filter and corresponding references to components in the EAC of FIG. 1 that implement the FIR filter.

FIG. 7 depicts a schematic diagram of a filter 900 having components labeled with reference to the components in the system 100. The filter 900 includes N taps and N−1 poles. The input signal source generates a time varying input signal x[n]. The input signal x[n] is supplied to each of the sample & hold buffers 108A-108(N−1), which sample and reproduce the input signal x[n] in a time delayed manner.

In the filter 900, the original signal x[n] and the time-delayed versions of the signal (x[n−1] . . . x[n−(N−1)]) for each tap are each assigned one of weighting values $b_0$-$b_N$ by being input through one of N input pins 128A . . . 128N. The weighting factor assigned to each of the taps is inversely related to the distance between a selected input pin 128 and a voltage sensor 132 that measures the charge in the electrically conductive material 124. The electrically conductive material 124 is large enough relative to the source input to be considered an infinite, homogenous and isotropic conductive medium for practical purposes. The charge potential Ø at the voltage sensor 132 for an input current I supplied to one of the input pins 128 is defined as:

$$\phi = \frac{1}{4\Pi\sigma r}$$

where r is the distance between the input pin 128 and the voltage sensor 132, and σ is the conductivity value of the electrically conductive medium 124. The distance includes the width separation (x), length separation (y), and height separation (z) between the input pin 128 and voltage sensor 132. In the three-dimensional EAC 102 in the system 100, $r=\sqrt{x^2+y^2+z^2}$, and $r=\sqrt{x^2+y^2}$ when the input pins 128 and voltage output 132 are arranged in a two-dimensional configuration.

The weighting factor $b_i$ for each of the taps is related to the relative strength of the charge potential Ø detected by the voltage sensor for the given tap. Thus, selecting an input pin 128 that is closer to the voltage sensor 132 increases the weight value, and selecting an input pin 128 that is farther from the voltage sensor 132 reduces the weight value. As the distance separating the input pin 132 and voltage sensor 132 increases, a corresponding total electrical resistance through the electrically conductive material 124 also increases, and the relative charge potential decreases. The sum of the charge potentials from each of the weighted taps generates the filtered output signal y[n]. The summation of multiple charge potentials from the time delayed signals in the electrically conductive material 124 represents a superposition of the charge potentials measured from each input pin 128 selected for the FIR filter.

Figure 8A:
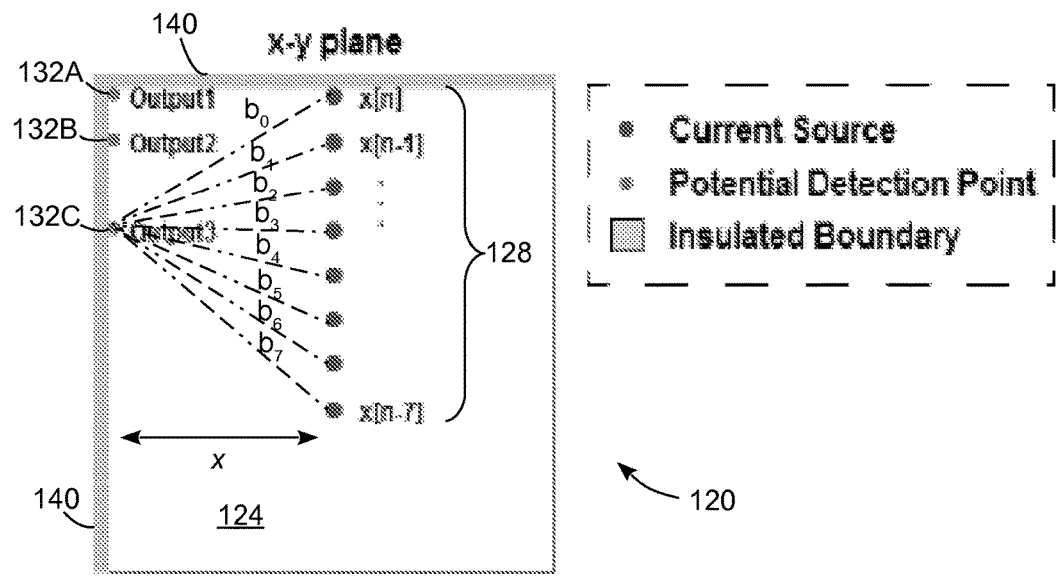
FIG. 8A is a schematic view of an analog processor configured to filter an input signal.
Figure 9:
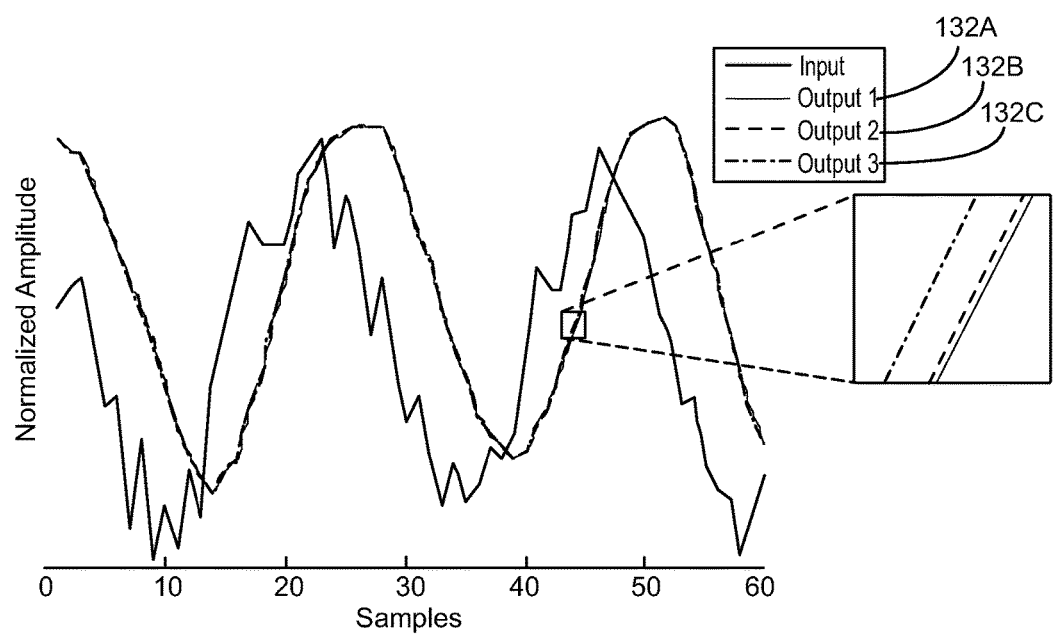
FIG. 9 is a signal plot depicting a noisy input signal and three output signals that are generated with the analog processor of FIG. 8A using a finite impulse response (FIR) filter to filter noise from a signal.

FIG. 8A depicts a two-dimensional arrangement of input pins 128 and voltage sensors 132A-132C that are configured to act as a Bessel filter, which is one type of FIR filter. In FIG. 8A, a total of eight (8) input pins 128 receive the input signal x[n], or a time-delayed version of the signal. The original input signal x[n] is supplied to an input pin 128 proximate to one of the insulated sides 140 of the electrically conductive material 124. The input pins are selected in a linear arrangement with the time delay increasing by one time increment for each successive input pin. In FIG. 8A, the eight input pins 128 correspond to an eight tap Bessel filter. In FIG. 8A, each of the voltage sensors 132A-132C is located at a constant distance from the line of input pins 128 along the x axis. Each of the voltage sensors 132A-132C detects a charge potential corresponding to the Bessel filtered output signal of the input signal x[n]. The distribution of the voltage sensors 132A-132C from the center of the linear arrangement of input pins 128 generates a time-offset in the detected output signals y[n]. Thus, the voltage sensors 132A-132C detect a family of Bessel filtered signals in parallel. As depicted in FIG. 9, voltage sensor 132C detects the filtered signal with the smallest amount of time-offset compared to the original input signal x[n], with increasing time offsets for voltage sensors 132B and 132A. Consequently, the analog processor 120 can generate multiple filtered output signals in parallel.

Figure 8B:
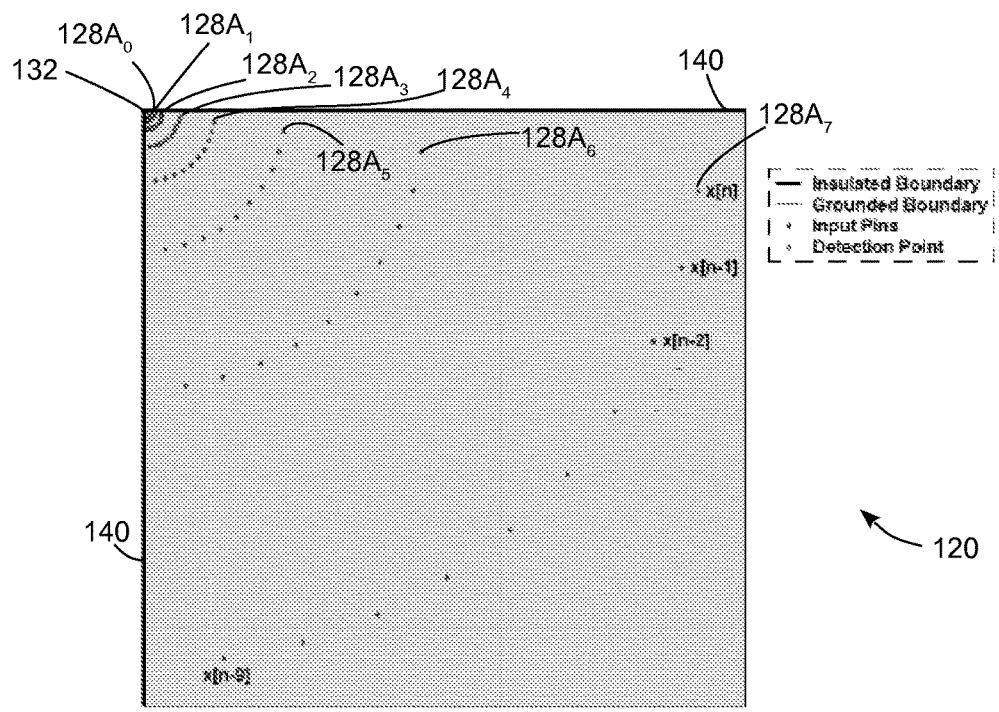
FIG. 8B is a schematic view of another configuration of an analog processor configured to filter an input signal.

FIG. 8B depicts another FIR configuration of the analog processor 120. In FIG. 8B, a single voltage sensor 132 detects the charge potential from eight different taps in an FIR filter. The EAC 102 can adjust the weight value for each tap by selecting an input pin at a predetermined distance from the voltage sensor 132. For example, one of the input pins $128A_0$-$128A_7$ depicted in FIG. 8B receives the input signal x[n]. The pins $128A_0$-$128A_6$ are arranged with the distance from the voltage sensor 132 increasing by a factor of two for each output pin. That is to say, the distance between the voltage sensor 132 and the output pin $128A_1$ is twice the distance between the voltage sensor 132 and the output pin $128A_0$, and the distance continues to double for successive input pins $128A_x$. The eight input pins $128A_0$-$128A_7$ provide multiple potential weight values for the filter tap. A greater number of input pins at varying distances from the voltage sensor 132 provide a higher resolution for selecting different weight values to improve the performance of the FIR filter.

Figure 8C:
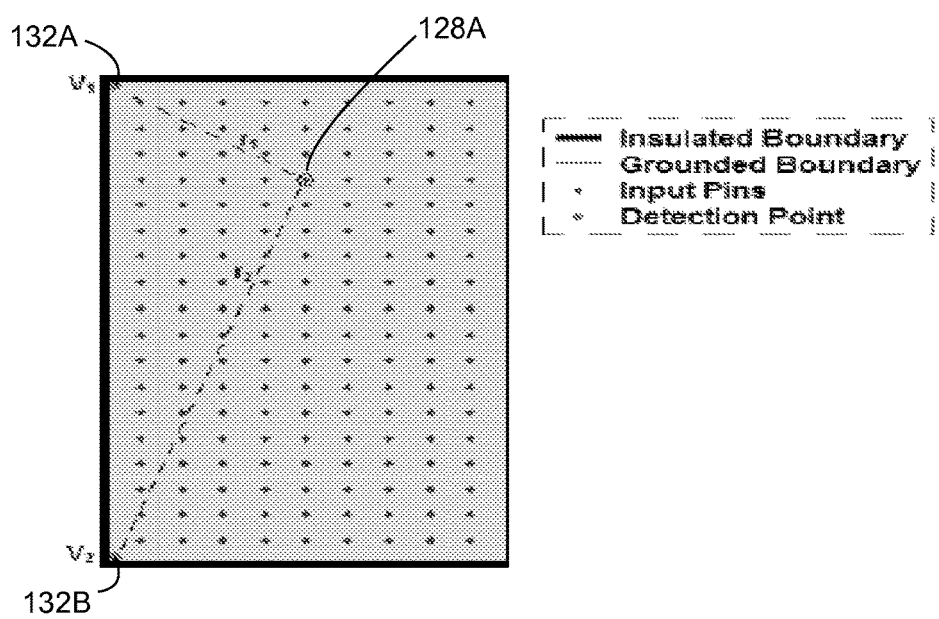
FIG. 8C is a schematic view of another configuration of an analog processor configured to filter an input signal.

As described above, the weight value for each input tap varies with the distance that separates the input pin 128 and corresponding voltage sensor 132. The weight value, however, is always positive, with the weight value approaching zero as the distance increases, which corresponds to a predetermined minimum value at a maximum distance between the input pin 128 and the voltage sensor 132 in the electrically conductive material 124. Some filter configurations also use negative weight values for one or more taps. To generate a negative weight, the EAC 102 measures two different charge potentials $Ø_{i1}$ and $Ø_{i2}$ using two of the voltage sensors 132 and a single input pin 128 corresponding to the tap with the negative weight value. As depicted in FIG. 8C, two voltage sensors 132A and 132B are each separated from the single input pin 128A by distances $r_1$ and $r_2$, respectively. In the example of FIG. 8C, the distance $r_2$ from voltage sensor 132 is twice the length of distance $r_1$. Because the weight values are inversely proportional to the distance r, a difference between the measured charges $Ø_{i2}$ and $Ø_{i1}$ at voltage sensors 132B and 132A, respectively, generates a negative value corresponding to a negative weight for the FIR filter.

In the EAC 102, the controller 112 selects the input pins 128 that receive the input signal from the input signal source 104 with the input switch fabric 116. When configured as an adaptive filter, the controller 112 receives feedback from the voltage sensors 132. When the controller 112 is a digital computer, the controller 112 typically converts the analog voltage values from the voltage sensors 132 into digital data values using an analog to digital converter (ADC). The controller 112 can control the adaptation of the FIR filter by changing the input pins 128 that receive the input signal with the input switching fabric 116. Additionally, in an embodiment of the EAC that includes multiple voltage sensors 132, the controller can select an output from one of the voltage sensors 132 with an output multiplexer 142 to provide to the signal generator 144. The EAC 102 can use various optimization techniques, including particle swarm optimization, to update the weights in the FIR quickly and efficiently. The EAC 102 implements an FIR that can adapt to changes in the input signal more quickly and while consuming less energy than conventional digital signal processing techniques.

In one configuration, the EAC 102 implements a matched filter. A matched filter is a type of FIR filter that includes weight values that are selected to perform an autocorrelation with a predetermined template waveform. For example, when measuring neural electrical signals, a single unit in a nerve fiber generates a known electrical signal. The matched filter in the EAC 102 is configured with weight values corresponding to the known electrical signal, which is the template. During operation, the input signal source 104 generates a neural input signal including noise and the neural signal from the nerve fiber. The EAC 102 filters the input signal 104 using the matched filter template to identify impulses from the single nerve unit in the noisy input signal.

Figure 10A:
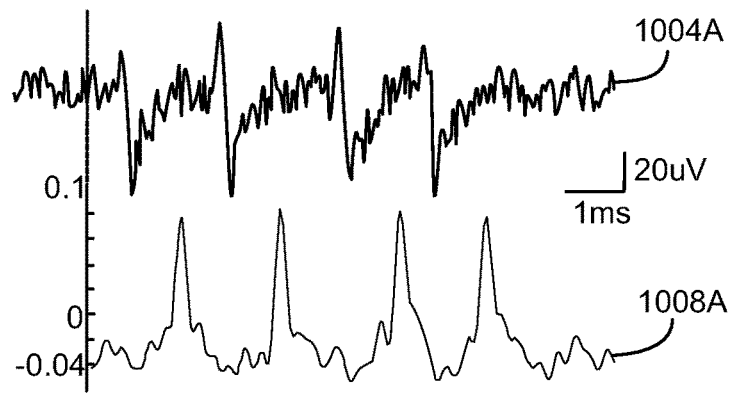
FIG. 10A is a signal plot depicting a neural electrical input signal with a 30% noise level and a filtered output signal generated with a match filter in the EAC of FIG. 1.
Figure 10B:
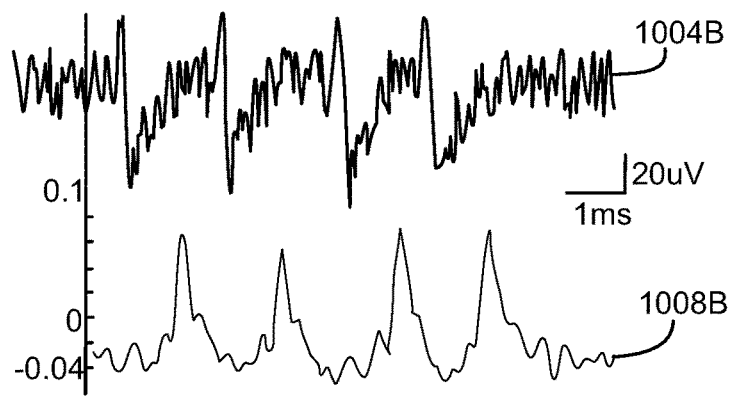
FIG. 10B is a signal plot depicting a neural electrical input signal with a 50% noise level and a filtered output signal generated with a match filter in the EAC of FIG. 1.
Figure 10C:
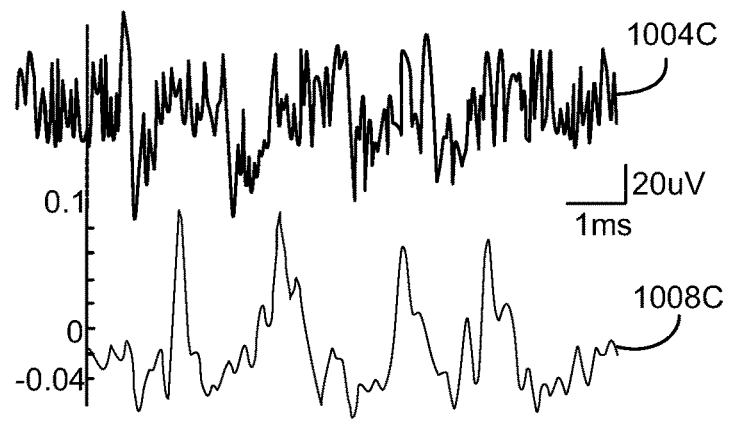
FIG. 10C is a signal plot depicting a neural electrical input signal with a 75% noise level and a filtered output signal generated with a match filter in the EAC of FIG. 1.

FIG. 10A-FIG. 10C depict noisy input signals 1004A, 1004B, and 1004C, respectively, that the system 100 measures from nerve activity in a subject. The EAC 102 generates corresponding filtered output signals 1008A, 1008B, and 1008C, respectively. The input signals 1004A-1004C include both spikes generated from electrical activity in a single nerve unit, as well as noise. In FIG. 10A, the noise level is 30% of the peak-to-peak amplitude of the nerve signal, FIG. 10B and FIG. 10C similarly depict noise levels of 50% and 75%, respectively. The matched filter implemented in the EAC 102 includes a template matching the expected waveform of the electrical impulses generated by the nerve. The EAC 102 generates the filtered output signals 1008A-1008C with at least a portion of the noise from the input removed to enable further measurement and analysis of the nerve activity in the subject.

In addition to the FIR filter, the EAC can be configured to act as an infinite input response (IIR) filter, or in a combination autoregressive moving average FIR-IIR filter. In contrast to (FIR) filters, the IIR filters are linear filters with an infinite memory length where the IIR filter acts upon the present and all past input samples. In some configurations, the IIR filter can be unstable, however, so a combination FIR-IIR auto-regressive moving average filter is used to provide a stabilized IIR filter. The FIR-IIR performs a calculation using a combination of the finite delayed samples of the input and output from an FIR filter as represented by the following equation: $y(n)=\Sigma_{i=0}^{M} b_i x(n-i)+\Sigma_{j=1}^{N} a_j y(n-j)$, where $y(n)$ is the filtered signal output at time n, $b_i$, are a set of M weight factors for an order M filter, $x(n-i)$ represent a history of M previous time signals, $a_j$ are a set of N weight values in an autoregressive filter of order N, and $y(n-j)$ are output delayed samples from the autoregressive filter. To implement the FIR-IIR filter using an EAC, the outputs of the EAC are redirected to inputs in the conductive material in the EAC in a recursive configuration. The recursive configuration enables implementation of an infinite impulse response (IIR) filter where the output is accumulated to enable an effectively infinite memory of previously received inputs when generating the impulse response.

Figure 11:
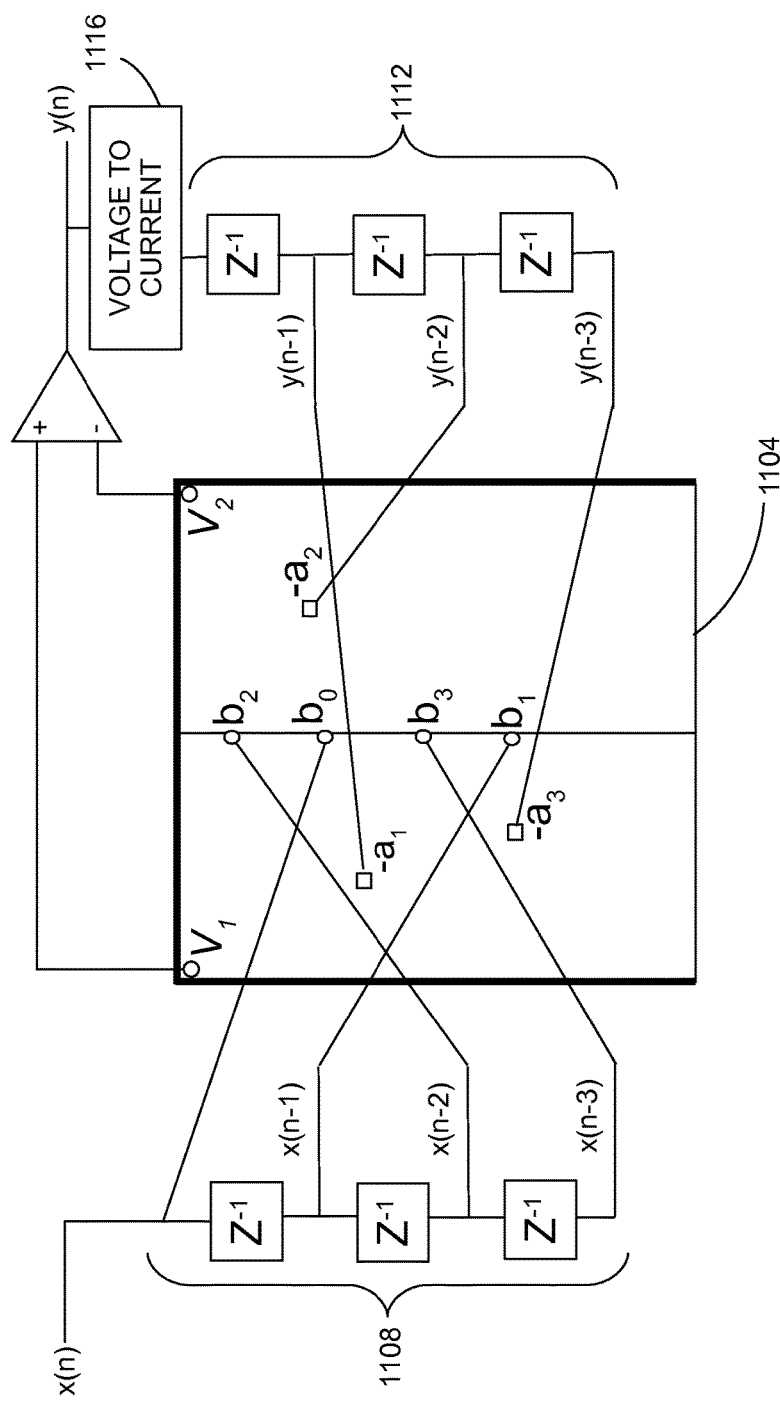
FIG. 11 is a schematic diagram of an EAC that is configured to act as an FIR and infinite impulse response (IIR) filter.

In an exemplary configuration, a third order low-pass Butterworth IIR filter with feed-forward coefficients, $b_i$, of 0.0031, 0.0093, 0.0090, and 0.0031 and feedback coefficients, $σ_j$, of −2.4222, 1.9969, and −0.5466 is formed using seven pin locations (x and y coordinates) in a conductive material. The pins are placed in locations in the conductive material to satisfy the following weighing function equation: $W(i)=$ $$k\left(\frac{1}{r_1(i)} - \frac{1}{r_2(i)}\right),$$

i=1 ... N, where i is the source tap number in N sources, $r_1(i)$ and $r_2(i)$ are the distances from the source i and the voltage sensors $V_1$ and $V_2$ respectively, and k is a scaling factor that is related to the conductivity of the conductive material in the EAC and the reflections due to insulated boundaries in the medium. In FIG. 11, four pins represent $b_0$, $b_1$, $b_2$, and $b_3$, and the remaining three pins represent $-a_1$, $-a_2$, and $-a_3$. The pins are placed in the conductive material 1104.

In one embodiment, an iterative numerical process identifies a set of randomized pin locations that satisfy the weighting function equation given above. For a weight value of $b_0$, a random distance $r_1$ is generated and $r_2$ is then calculated by using the weighting function. Using the law of sines and cosines given the dimensions of the electrically conductive material enables identification of a coordinate pair x, y relative to the $V_2$ sensor. This process is repeated for all the weight values of the weighting function.

In the Butterworth filter of FIG. 11, the present and three prior delayed samples of the input stored in sample-and-hold buffers 1108 are assigned to the feed-forward coefficients so that the performed equation calculated by the EAC of this part is the same for an FIR filter as set forth in the following equation:

$$y(n)_{feedforward}=\Sigma_{i=0}^{3} b_i(n-i)=b_0(n)+b_1 x(n-1)+b_2 x(n-2)+b_3 x(n-3)$$

The three most recent output voltage samples are stored in buffers 1112 for recursion into input of the EAC conductive medium for use in generating the output filter results during a subsequent time period. The three most recent output voltage values are converted to currents with transconductance amplifiers 1116 and then injected to the feedback coefficient pins $a_1$-$a_3$ to satisfy the feedback equation:

$$y(n)_{feedback} = \Sigma_{j=1}^{3} -a_j y(n-j) = -a_1 y(n-1) - a_2 y(n-2) - a_3 y(n-3),$$

where $y(n) = y(n)_{feedforward} + y(n)_{feedback}$.

Figure 12:
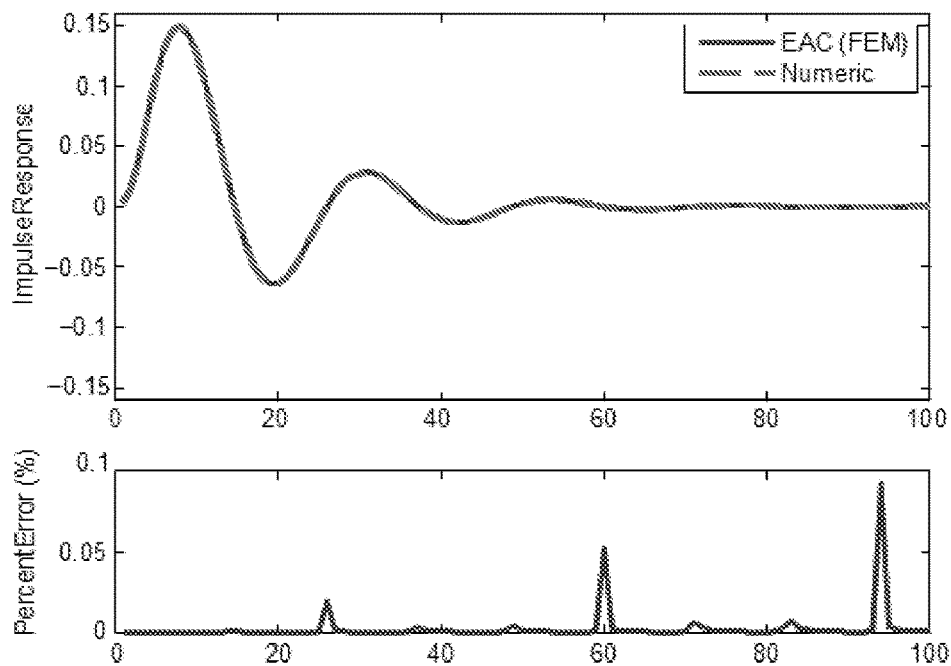
FIG. 12 is a graph of an impulse response of an FIR-IIR filter implemented with the EAC of FIG. 11 compared to a simulated filter response.

In one operational mode, the FIR-IIR implementation in the EAC of FIG. 11 generated one hundred samples of the impulse response of the FIR-IIR filter through injection of an impulse function as an input signal x(n). As shown in FIG. 12, the impulse response of the EAC system is compared to the numeric impulse response of the same system determined by numerical simulation, with an error of less than 0.1% for each point in FIG. 12.

Figure 13:
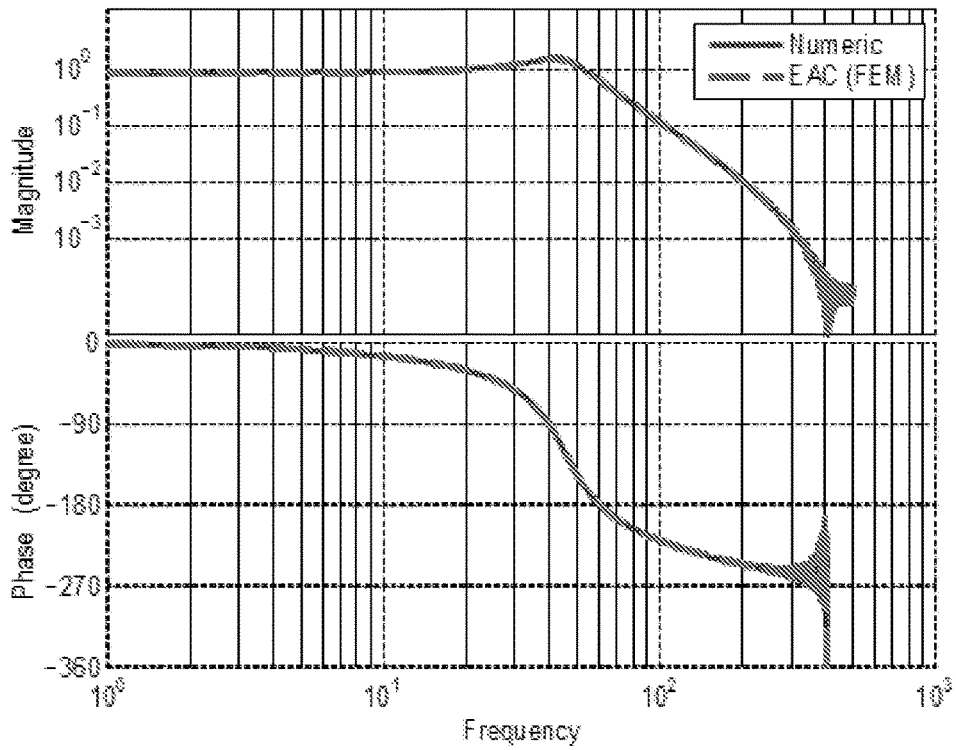
FIG. 13 is a Bode magnitude and phase plot for the FIR-IIR filter of FIG. 11 compared to a simulated filter response.

Furthermore, FIG. 13 depicts the Bode plot of the filter implemented by the EAC in FIG. 11 compared to a Bode plot of the numeric solution. The numeric and experimental outputs are substantially equivalent with little to no differences observed. Thus, the EAC depicted in FIG. 11 implements the FIR-IIR filter. More generally, the EAC of FIG. 11 using feed-forward and feedback input pins in different arrangements can implement any arbitrary linear transfer function. The implementation is only practically limited by some factors such as the packing density of the pins and the number of sample-and-hold transconductance amplifiers, and the bandwidth of the sample-and-hold electronics. For example, for an $N^{th}$ order FIR or IIR includes N contact pins on the EAC and sample-and-hold buffers, while a combined FIR-IIR filter uses 2N pins for the $N^{th}$ order filter. The number of pins is limited by the size of the pins (diameter) and the dimensions of the conductive material. Moreover, sources and measurement points should be placed outside the constricting zone and relatively apart from each other. The order of the filter is also limited by the hardware of the EAC by the number of sample-and-hold buffers in both the input sample-and-hold circuit and the transconductance amplifiers. The bandwidth of the sample-and-hold electronics may also cause some limitations of the speed of the EAC device.

As describe above, the EAC can be configured to perform FIR filtering, and also IIR filtering using an FIR-IIR configuration that incorporates recursion. Thus, the EAC can be used in a wide range of signal processing applications. An example of one such signal processing application is in neural signal processing. In one configuration, the EAC implements one or more match filters that correspond to electrical signals generated during a single fiber action potential (SFAP) reaction in nerve tissue. SFAP analysis includes both spike detection and spike identification. As described below, the EAC can be configured to implement match filters to perform both spike detection and spike identification.

Spike detection is a necessary step for spike classification devices. One method of spike detection includes application of a matched filter (MF) to recorded electrical neural activity signals. The matched filter, is a form of FIR filter, and correlates the presence of a known wavelet template with potential matching spikes in an unknown signal that may be contaminated with noise. The correlation is produced through cross-correlation of the template wavelet with the unknown signal with reference to the following equation: $y(n) = \Sigma_{i=0}^{M} b_i x(n-i)$, where $b_i$ are a set of M weight values of the matched filter for an order M filter, and x(n−i) represents the time signal x(n) at the present time and for each of the 1 . . . M discrete time increments in the past, y(n) is the output filtered signal at time n, which its normalized output to the largest amplitude is ranged from −1 to 1 where −1, 0, and 1 indicate that the template and the unknown signal are inversely correlated, uncorrelated, and perfectly correlated respectively. The matched filter results can be obtained by averaging the expected shapes of the spike wavelets and then using the averaged shapes as the weights of the filter. The matched filters use wavelet forms corresponding to known shapes of spikes in an SFAP. Because the matched filters are a form of FIR, the EAC configurations described above can be configured to implement the predetermined wavelet shapes of the matched filters. Additionally, the matched filters can be used in spike identification.

Figure 14:
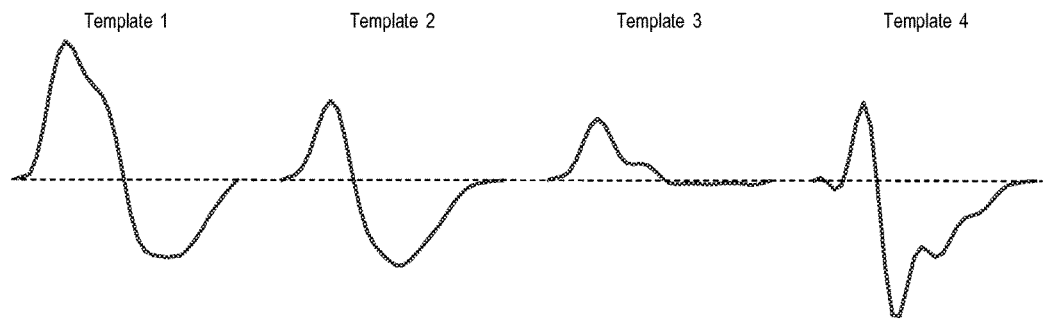
FIG. 14 is a set of templates used to filter electrical signal data to match SFAP signals.

A single matched filter only identifies and clusters one unit from the neurological input data stream. SFAP signals can include multiple spikes with different matched filter signatures. Thus, multiple matched filters (one for each spike) need to be implemented in order to cluster all spikes in the multiunit neural activity. Therefore, the EAC implements multiple matched filters to detect ENG spikes and also to identify a target spike of the multiple units in the neural activity. Each EAC sheet can implement entire families of FIR filters. Depending upon the geometry, at least one matched filter can be realized. In the example described herein, at least one matched filter is implemented using a single EAC. In other configurations, however, a single EAC can be configured to implement multiple FIR filter solutions in a single sheet. FIG. 14 depicts a series of wavelet templates that correspond to different unit spikes.

The EAC is configured to implement the matched filters to detect SFAP spikes, the timing of the SFAP spikes, timing and class of each action potential in an ENG neural activity signal. The EAC implements the matched filters to effectively reject background noise and identify the SFAP spikes with low inclusion (type 2) and exclusion (type 1) errors.

Figure 15:
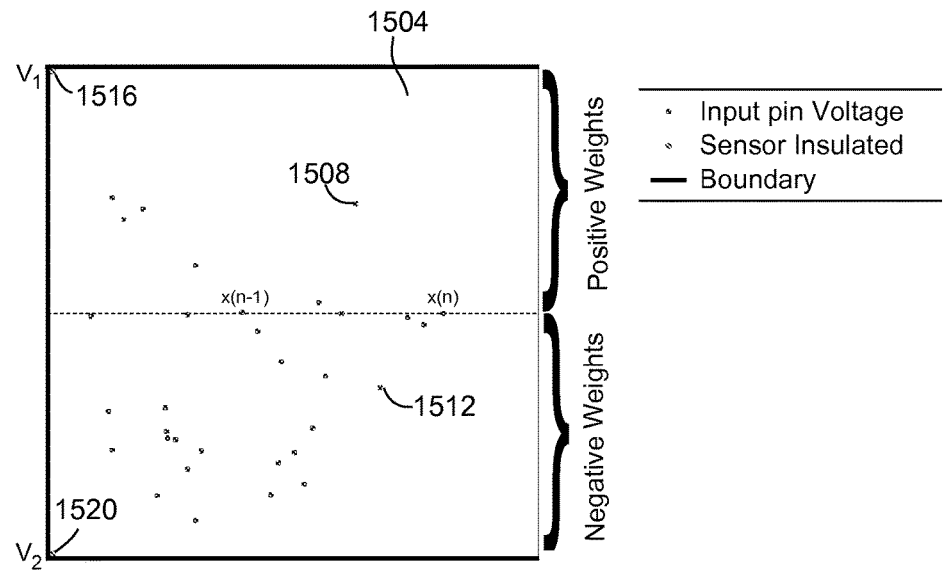
FIG. 15 is a schematic view of a randomized arrangement of inputs for detection of an SFAP signal in an EAC.

FIG. 15 is a schematic depiction of the EAC configured to implement the matched filters for detection of an SFAP. The input pins are arranged in the conductive material 1504, with some input pins, such as input pin 1508, positioned to provide a positive filter weight and other input pins, such as pin 1512, positioned to provide a negative filter weight. In the configuration of FIG. 15, the EAC includes two voltage sensors 1516 and 1520 that detect signals from the input pins. As discussed above, the voltage magnitude of the action potential characterizes the weighting function of the matched filter, which includes positive and negative values. Thus, differential measurement method is used where the two voltage sensors 1516 and 1520 are monitored at two different corners of the orthogonal insulated boundaries in the conductive medium 1504. Then, random locations of current inputs in the EAC are identified where the weighing function satisfies the equation.

$$W(i) = k\left(\frac{1}{r_1(i)} - \frac{1}{r_2(i)}\right),$$

i=1 . . . N

Figure 16:
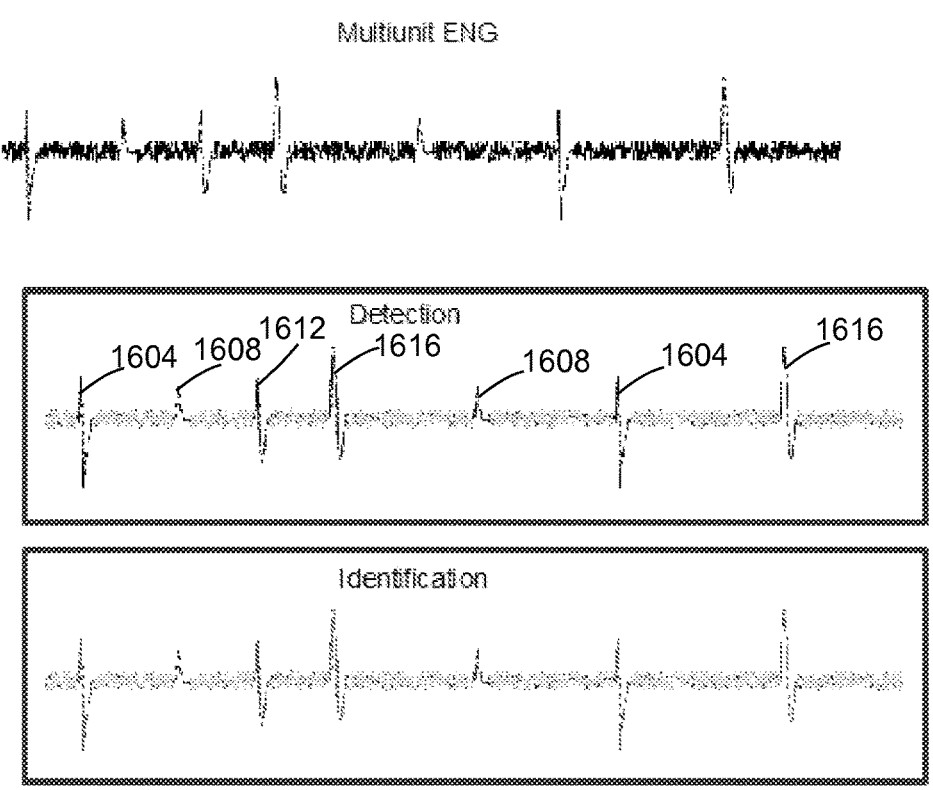
FIG. 16 is a series of graphs depicting single fiber action potential (SFAP) signals in a nerve and detection of the signals in recorded data using an EAC.

The EAC depicted in FIG. 15 is configured to apply the matched filter to an electroneurogram (ENG), such as the ENG signal depicted in FIG. 16. The matched filters can detect spikes, such as spikes 1604, 1608, 1612, and 1616 in the noisy ENG data. Since the SFAP can include multiple spike shapes, the identification phase identifies the waveform that is most closely associated with each detected spike. For example, the identification of the waveform in FIG. 16 finds two instances of the spike waveforms 1604, 1608, and 1616, while finding one instance of the spike waveform 1612. The matched filters implemented in the EAC enable both detection of spikes in the ENG signal, and identification of the particular waveform of each spike that is generated during SFAP activity.

Figure 17:
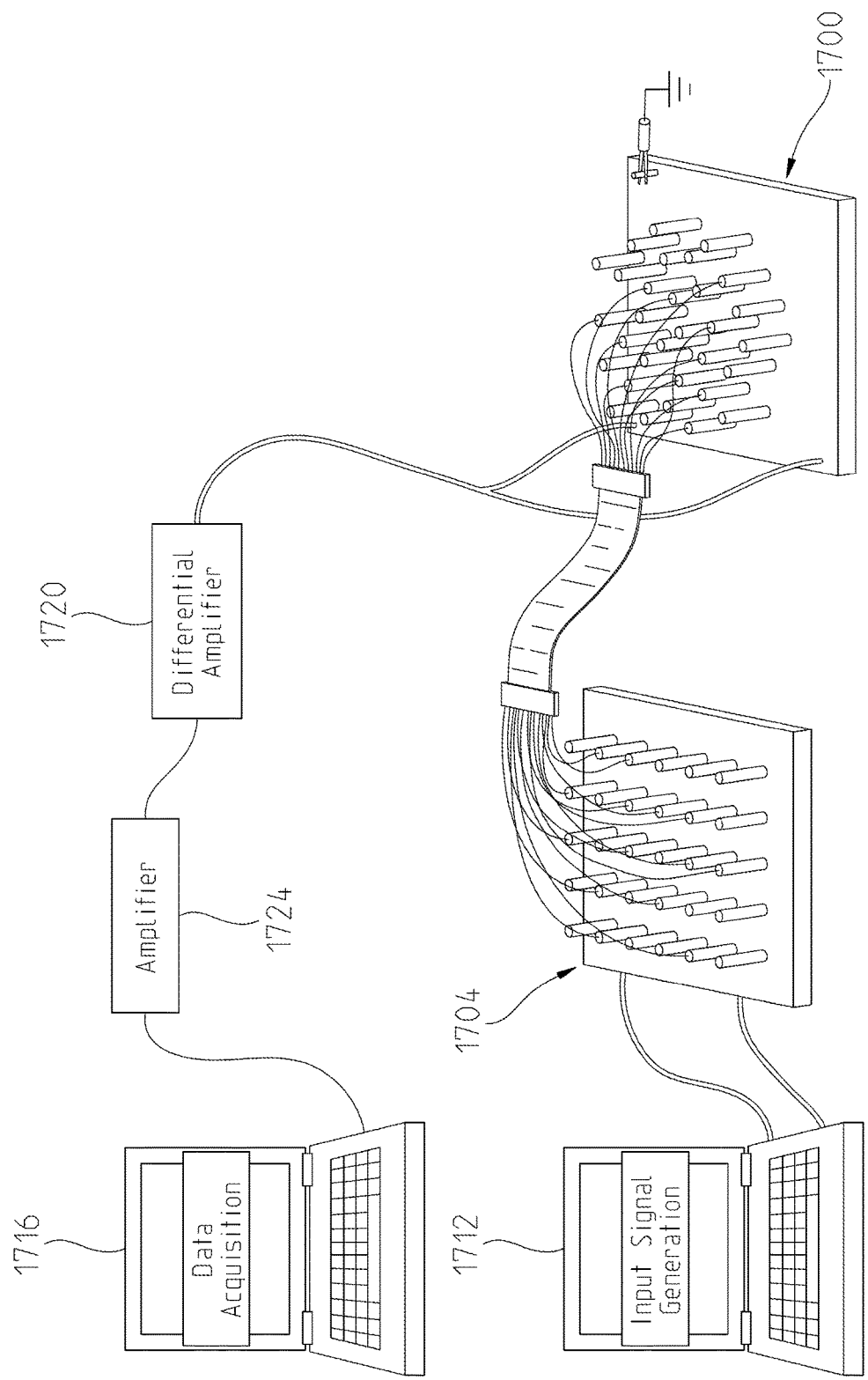
FIG. 17 is a schematic diagram of an embodiment of an EAC that is configured for signal detection using a matched filter.

FIG. 17 is a schematic diagram of an exemplary configuration of two EACs 1700 and 1704 that are configured to identify SFAPs in electrical signals corresponding to nerve activity using the matched filters. The matched filter configuration, shown in FIG. 15 is implemented with an 8-bit resolution EAC 1700. The EAC 1700 includes a sheet of isotropic conductive foam with conductivity of 0.1 S/m and dimensions of 11.5×11.5×0.5 cm. One side (11.5×0.5 cm) is electrically grounded using two catheter needles inserted horizontally opposite of each other and connected to a ground point. Thirty-two hypodermic needles are arranged in the foam, as shown in FIG. 17, to represent the weighting function of the single unit template. In the configuration of FIG. 17 two different EACs are electrically connected to each other with conductive foam in the first EAC 1700 including 25 of the 32 pins, the remaining 7 pins being placed in the conductive foam of a second EAC 1704.

Both EACs 1700 and 1704 are connected to a computer 1712 that generates a simulated input signal to the 32 input points through the configured needles. The input signal is injected through the 32 input needles as electric currents that flow through the conductive foam in each of the EACs 1700 and 1704. The differential measurement V1–V2 from the voltage sensors is captured using an ultralow noise differential amplifier 1720 (Axon Instruments AI 402 x50). The output of the differential amplifier 1720 is passed to a second-stage amplifier 1724 (Axon Instruments CyberAmp 320) and the differential measurement signal is converted into a digital format for processing on data acquisition software executed on a computer 1716. The output data are sampled with a frequency of 2 kHz and the data acquisition software implements a low-pass filter with cutoff frequency of 600 Hz to filter low-frequency noise. The EAC is configured to inject or measure maximum current or voltage of 200 μA and 5 V respectively for each pin. In the example of FIG. 17, the EACs inject a scaled version of input signal as currents where the maximum value is 200 μA.

In the EAC system of FIG. 17, the computer 1712 generates an impulse of 200 μA, which is injected and propagated through the input pins to measure the implemented weights of the matched filter to correspond to one unit in an SFAP. The measured weights can be compared to a numerically predicted weight to identify a percentage error for each of the measured weights. The correlation coefficient of the predicted and the measured weighting function indicate the goodness of fit and accuracy of the implemented weights. The 32-point target action potential unit is injected and propagated through the 32 input pins in the matched filter, and the data acquisition computer 1716 records the output signal after application of the matched filters to the impulse. While the computers 1712 and 1716 are depicted as separate devices for illustrative purposes, a single computer can be configured to provide input signals and acquire output data from the EAC.

After identifying the impulse response of the matched filters in the EAC, an unfiltered ENG signal, such as the ENG signal of FIG. 16 that includes noise in addition to SFAP signals, is passed through the matched filter to identify the SFAP target unit that matches the template (filter weights) within the ENG signal. Since background noise in neural signal is a major obstacle in the detection process, the matched filter on the EAC is configured to filter signals with various signal-to-noise ratios (SNR) of the single unit, where the noise component is peak-to-peak white noise.

Figure 18:
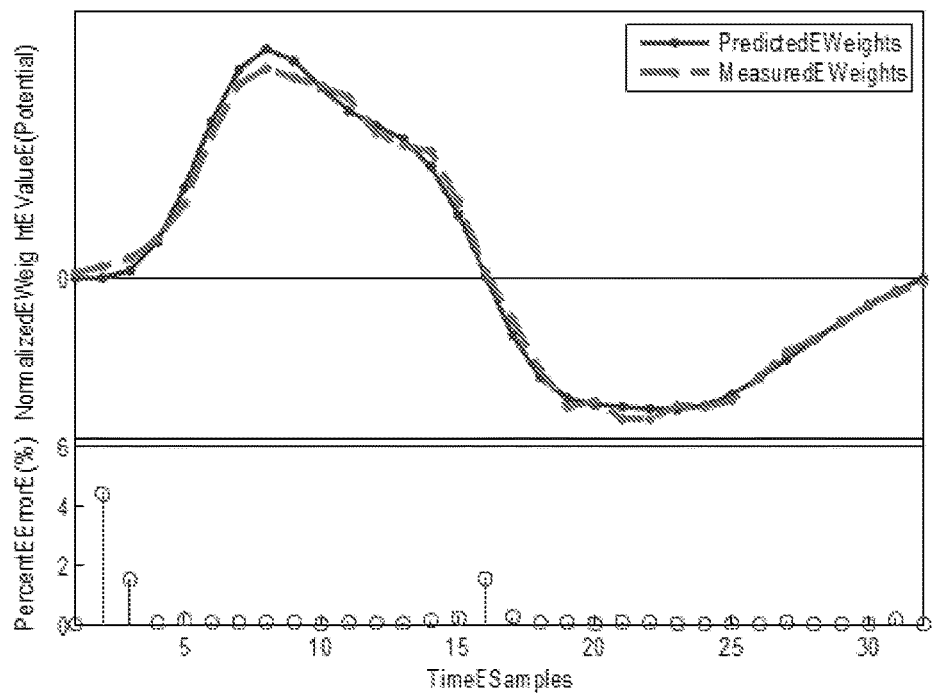
FIG. 18 is a graph depicting a predicted response of the EAC to an SFAP impulse signal and the actual response of the EAC of FIG. 17.

FIG. 18 is a graph depicting a comparison between measured weights in the EAC of FIG. 17 with the predicted weights and percent error of each of the measured weight values in a simulated model of the matched filter. In FIG. 18, the correlation coefficient of the predicted and the measured weighting function is 0.9837 and the maximum observed percent error of the weights is less than 5%. Thus, the weighting function provided above for identification of input pin placement in the EAC enables accurate placement of the input pins to produce filter weights corresponding to the predetermined matched filter templates.

Figure 19:
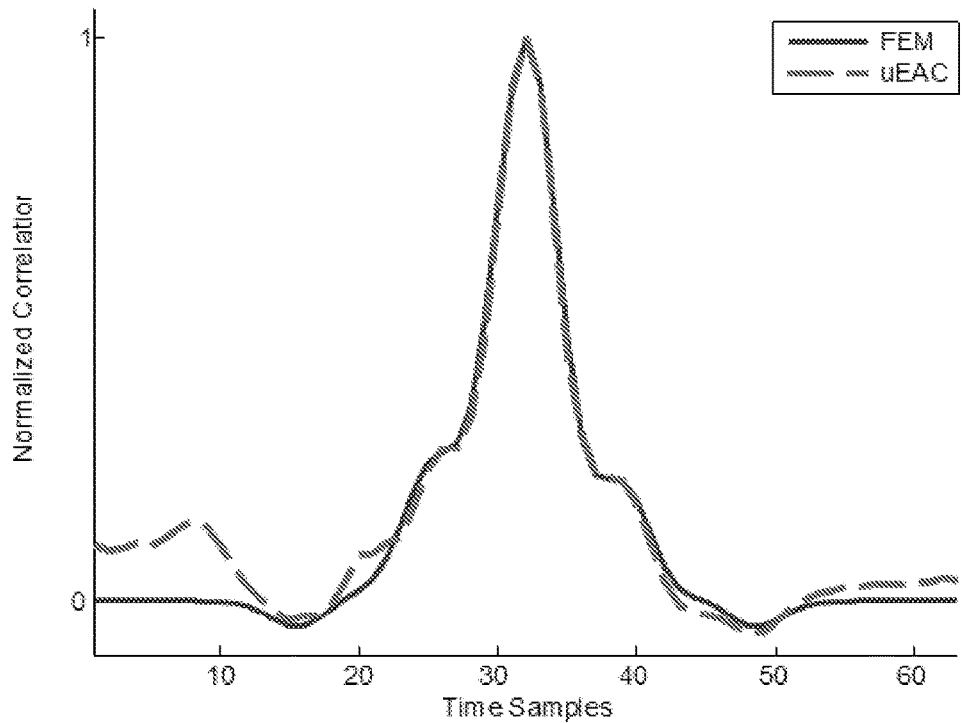
FIG. 19 is a graph depicting a response of a filter in a finite element model (FEM) simulation to an SFAP impulse signal and the actual response of the EAC of FIG. 17.

FIG. 19 depicts the output of the match filter in the EAC in comparison to a finite element method (FEM) simulation of the matched filter applied to a spike in the ENG signal. In FIG. 19, the output of injecting the target spike to the designed matched filter by the EAC through FEM simulation gives the auto-correlation function. As shown in FIG. 19, the output is compared to the auto-correlation of the single unit determined numerically to evaluate the accuracy of the EAC filter implementation. The output of the EAC simulation by FEM matched the auto-correlation function with some error that is due to Finite Element meshing and input locations rounding error. The goodness of fit correlation is approximately 0.9923. Thus, the output of the EAC matched filter closely corresponds to simulated results of a matched filter applied to the ENG signal data.

Figure 20:
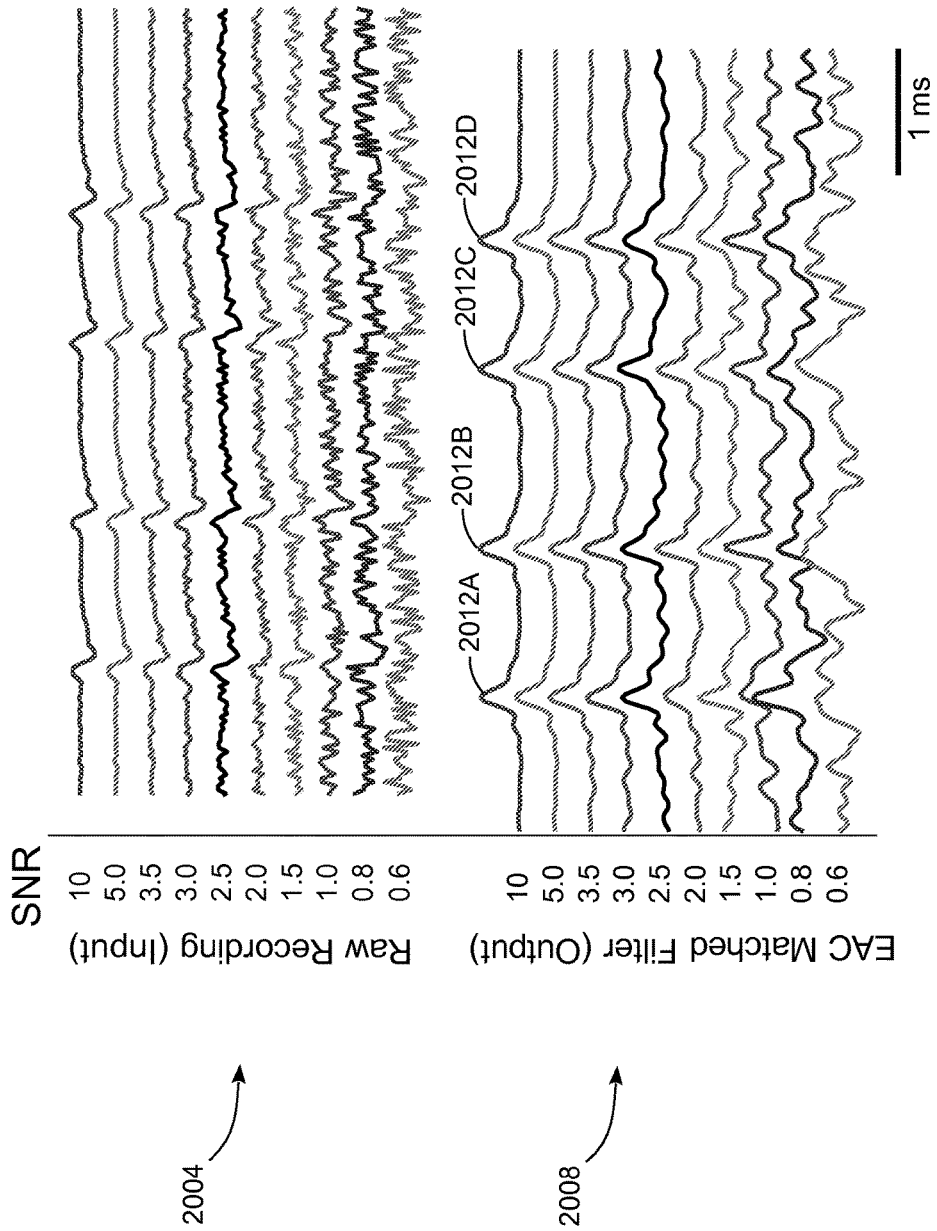
FIG. 20 is a series of graphs depicting an Electroneurogram (ENG) signal and response of a digital signal processor (DSP) and the EAC of FIG. 17 to the ENG signal.

FIG. 20 depicts synthetic ENG input signals including SFAP spikes at various signal-to-noise (SNR) ratios, and the output of the filtered signal from the EAC for each input signal. In FIG. 20, the inputs 2004 have a range of SNR values from 10, with the lowest relative noise level, to 0.6 with the highest relative noise level. The corresponding EAC outputs 2008 depict SFAP spikes, such as spikes 2012A-2012D at each of the SNR levels. As depicted in FIG. 20, the EAC can detect and identify spikes in ENG data over a wide range of SNR levels.

Figure 21:
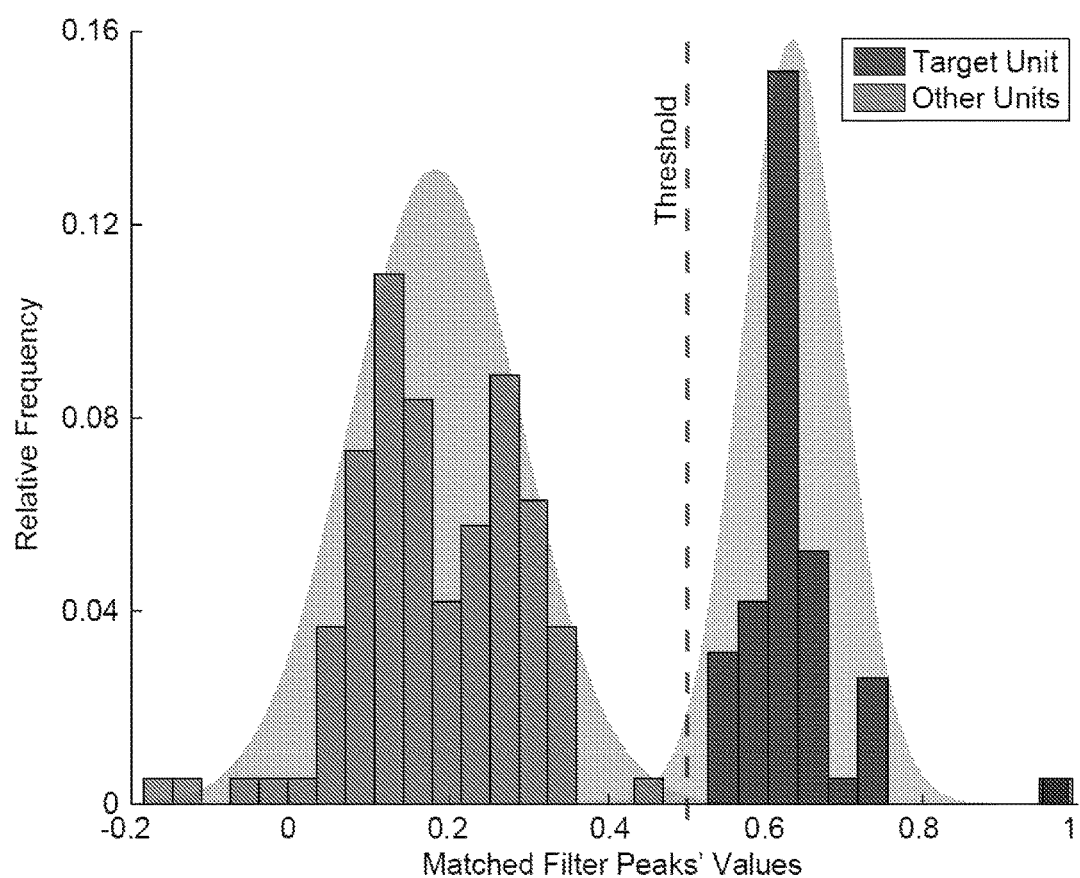
FIG. 21 is a graph of frequency action potentials in the matched filter results.

In addition to comparing the EAC to FEM simulation results, the performance of the EAC is favorable in comparison to prior art digital signal processor (DSP) matched filter implementations. The matched filter was able to identify the target single unit from the neural signal record. The matched filter performed remarkably well, rejecting the background noise and the lower frequency baseline oscillation while marking instances of nerve activities correctly. Normalizing the matched filter data, a threshold value of approximately 0.5 was determined to achieve the best identification accuracy in terms of inclusion and exclusion error, as shown in FIG. 21. The inclusion error is the probability that the system incorrectly matches the input templates to the target template, where the exclusion error is the probability that the system fails to detect the input templates to the target template. In the designed system, the inclusion error and exclusion error were calculated to be approximately 0.02 and 0.00, respectively.

Figure 22:
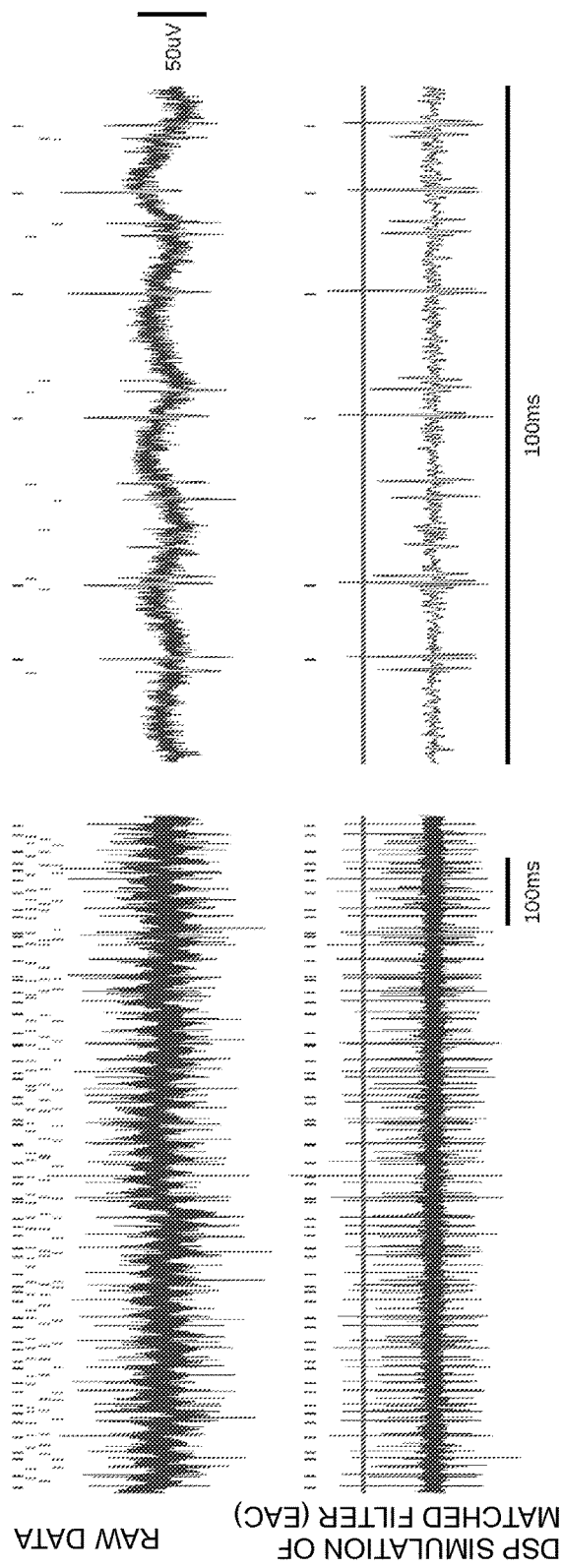
FIG. 22 is a graph depicting unfiltered ENG data including a unit of an SFAP impulse, and the filtered signal produced with a DSP simulation of an EAC.
Figure 23:
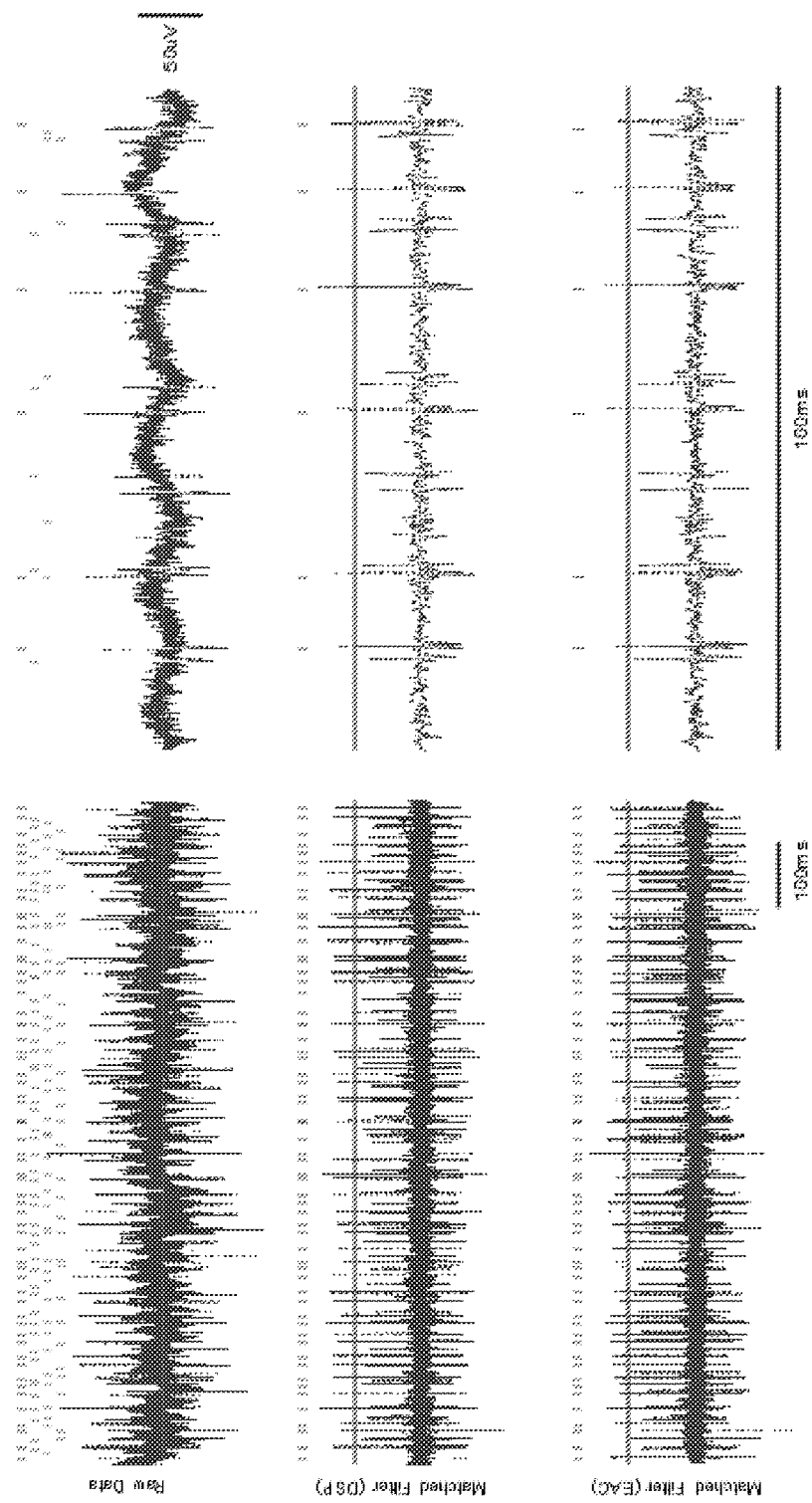
FIG. 23 is a graph depicting unfiltered ENG data including a unit of an SFAP impulse, the signal produced using a filter implemented with a prior art digital signal processor, and the filtered signal produced with the EAC of FIG. 17.

FIG. 22 depicts the matched filter detector/identifier of the target unit in the raw ENG data (top) implemented with a DSP device that is simulating the EAC (bottom). The traces on the right half of FIG. 22 are a detailed view of a 100 ms region of the 1 s traces on the left half of FIG. 22. FIG. 23 depicts the matched filter detector and identifier of the target unit of the raw ENG data (top) implemented with a DSP device (middle) and with the actual results from the EAC of FIG. 17 (bottom). The right traces are a detailed view of a 100 ms region of the 1 s traces (left). The quality of the matched filter by the EAC is equivalent to the quality of the same filter by a DSP device. As shown in FIG. 23, the matched filter results by the EAC were equivalent to the results by the DSP computer simulations of the EAC, with a root mean square error of only 1.4%. Thus, the EAC is a reliable device that produces filtered signals that are comparable to the output of quality of DSPs.

As described above, the EAC implementation can produce filtered signals with comparable accuracy to existing DSPs. Therefore, the EAC is not only equivalent to DSPs in terms of quality, but it outperforms DSPs in many other extents such as power consumption, operational speed, and ability of parallel computations to have a family of solutions simultaneously. Therefore, the EAC is a novel technique that overcomes many obstacles in the signal processing world. In the next few decades, the EAC might be developed in several forms to solve several signal processing problems that DSPs cannot solve. Moreover, the EAC has high potential to become an implantable device that can be used for neural signal processing.

The EAC embodiments described above enable real-time signal processing, including real-time processing of neural signals. The EAC solves linear functions, such as summation and multiplication, effectively and nearly instantaneously. In a resistance operating mode, the conductive material in the EAC generates sums for all inputs, and operates as a three-dimensional series of resistors, where the distance between the current input and voltage detection point represents the reciprocal of the resistance value. This allows solving any radial bases function to possibly work as an artificial neural network. Additionally, multiple inputs can be injected simultaneously and the EAC performs parallel computations on each of the inputs.

The EAC can be configured to solve spatial differential equations and implement linear filters in the time domain. As described above, the EAC implements any Finite Impulse Response (FIR) filter where the filter weights are inversely proportional to the distance between input sources and the detection point in the volume conductor.

While the preferred embodiments have been illustrated and described in detail in the drawings and foregoing description, the same should be considered illustrative and not restrictive. All changes, modifications, and further applications are desired to be protected. Additional aspects of the EAC described above are attached to this document as Exhibit A and Exhibit B, the contents of which are expressly incorporated herein.

The invention claimed is:

1. An extended analog computer comprising:
   an electrically conductive material formed with a plurality of sides, at least one of the plurality of sides being isolated from an electrical ground;
   a ground conductor electrically connected to another one of the plurality of sides of the electrically conductive material, the ground conductor adapted for electrical connection to the electrical ground;
   a plurality of electrically conductive pins connected to the electrically conductive material, each of the plurality of electrically conductive pins being configured to input an electric current into the electrically conductive material; and
   at least one voltage sensor connected to the electrically conductive material, the voltage sensor being configured to generate a voltage signal corresponding to a charge potential generated in the electrically conductive material by the electric current from each of the plurality of electrically conductive pins.

2. The extended analog computer of claim 1, wherein the electrically conductive material is a substantially isotropic electrical conductor.

3. The extended analog computer of claim 1, wherein the electrically conductive material is formed with a predetermined length, width and height, the height less than the length and the width, wherein the electrically conductive material comprises an anisotropic electrical conductor having a lower electrical conductivity through the height of the electrically conductive material than another electrical conductivity through the length and the width of the electrically conductive material.

4. The extended analog computer of claim 1, wherein at least one of the electrically conductive pins in the plurality of electrically conductive pins is disc shaped.

5. The extended analog computer of claim 1, wherein at least one of the electric electrically conductive pins in the plurality of electrically conductive pins is spherically shaped.

6. The extended analog computer of claim 1, wherein at least one of the electrically conductive pins in the plurality of electrically conductive pins is cylindrically shaped.

7. The extended analog computer of claim 1 wherein the electrically conductive material is an electrically conductive foam having an electrical conductivity of approximately 1 Siemen per meter.

8. The extended analog computer of claim 1, wherein the plurality of electrically conductive pins are arranged in a substantially uniform three-dimensional grid in the electrically conductive material.

9. The extended analog computer of claim 1, further comprising:
   a controller operatively connected to the plurality of electrically conductive pins and the at least one voltage sensor, the controller being configured to:
      selectively connect an input electrical current source to at least one of the electrically conductive pins in the plurality of electrically conductive pins to input an electrical signal;
      detect an output voltage signal with the at least one voltage sensor; and
      generate an output electrical signal in response to the detected output voltage signal.

10. The extended analog computer of claim 9, wherein the controller connects the input electrical current source to the at least one of the electrically conductive pins to generate a finite input response filtered signal from the electrical signal, the finite input response filtered signal being detected by the output voltage sensor.

11. The extended analog computer of claim 9, further comprising:
   a voltage to current converter configured to generate another electrical signal in response to a voltage of the output electrical signal; and
   the controller being further configured to:
      selectively connect at least another pin in the plurality of electrically conductive pins to the voltage to current converter to receive the another electrical signal to generate an infinite input response filtered signal.

12. The extended analog computer of claim 9, the controller being further configured to:
   selectively connect the input electrical current source to at least one of the electrically conductive pins in the plurality of electrically conductive pins to form a matched filter;
   and
   identify a spike in the output electrical signal corresponding to a shape of the matched filter.

13. The extended analog computer of claim 12, wherein the input electrical signal is an electroneurograph of nerve activity including a single fiber action potential (SFAP) and the matched filter matches a spike in the SFAP.

14. The extended analog computer of claim 9, wherein the electrical signal is a time varying electrical signal.

15. The extended analog computer of claim 1, wherein a second of the plurality of sides of the of the electrically conductive material is isolated from the electrical ground, the second of the plurality of sides and the another of the plurality of sides are joined at an edge, and the at least one voltage sensor is positioned adjacent to the edge.

16. The extended analog computer of claim 15, wherein a third of the plurality of sides of the electrically conductive material is isolated from the electrical ground, the second, the third, and the another of the plurality of sides are joined at a corner, and the at least one voltage sensor is positioned adjacent to the corner.

17. The extended analog computer of claim 1, wherein the plurality of electrically conductive pins are arranged in a plurality of radial lines extending outward from the at least one voltage sensor.

18. The extended analog computer of claim 17, wherein the plurality of electrically conductive pins are arranged in a denser configuration near the at least one voltage sensor and are spaced at increasingly greater intervals as a distance from the at least one voltage sensor increases.

19. An extended analog computer comprising:
an electrically conductive material;
a plurality of electrically conductive pins connected to the electrically conductive material, each of the plurality of electrically conductive pins being configured to input an electric current into the electrically conductive material;
at least one voltage sensor connected to the electrically conductive material, the voltage sensor being configured to generate a voltage signal corresponding to a charge potential generated in the electrically conductive material by the electric current from each of the plurality of electrically conductive pins;
sample and hold buffers configured to sample a time varying input signal in a delayed manner;
a controller operatively connected to the plurality of electrically conductive pins and the at least one voltage sensor, the controller being configured to:
selectively connect the sample and hold buffers to electrically conductive pins in the plurality of electrically conductive pins to input the sampled time varying input signal;
detect an output voltage signal with the at least one voltage sensor; and
generate a finite input response filtered signal in response to the detected output voltage signal.

20. The extended analog computer of claim 19, wherein the controller is configured to:
selectively connect the sample and hold buffers to the electrically conductive pins based on respective distances between the electrically conductive pins and the at least one voltage sensor to form a matched filter; and
identify a spike in an output electrical signal corresponding to a shape of the matched filter.

21. The extended analog computer of claim 20, wherein the time varying input signal is an electroneurograph of nerve activity including a single fiber action potential (SFAP) and the matched filter matches a spike in the SFAP.

22. A signal identification method comprising:
selectively connecting an input electrical current source to at least one electrically conductive pin in a plurality of electrically conductive pins to input an electrical signal, the plurality of electrically conductive pins connected to an electrically conductive material connected to a ground on one side and isolated from the ground on another side;
detecting an output voltage signal with a voltage sensor connected to the electrically conductive material; and
generating an output electrical signal in response to the detected output voltage signal.

23. A signal identification method comprising:
sampling a time-varying electrical signal in a delayed manner;
selectively connecting electrically conductive pins in a plurality of electrically conductive pins to an electrically conductive material to input the sampled time-varying electrical signal;
detecting an output voltage signal with a voltage sensor connected to the electrically conductive material; and
generating a finite input response filtered signal in response to the detected output voltage signal.

* * * * *